United States Patent
Kanemoto

(10) Patent No.: US 8,637,966 B2
(45) Date of Patent: Jan. 28, 2014

(54) SEMICONDUCTOR DEVICE

(71) Applicant: Renesas Electronics Corporation, Kawasaki (JP)

(72) Inventor: Koichi Kanemoto, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/716,985

(22) Filed: Dec. 17, 2012

(65) Prior Publication Data

US 2013/0154075 A1    Jun. 20, 2013

(30) Foreign Application Priority Data

Dec. 16, 2011 (JP) ................. 2011-276483

(51) Int. Cl.
- *H01L 23/495* (2006.01)
- *H01L 23/48* (2006.01)
- *H01L 23/52* (2006.01)
- *H01L 29/40* (2006.01)

(52) U.S. Cl.
USPC .......... 257/676; 257/777; 257/E23.046; 257/E23.052; 257/E23.124; 257/E25.001

(58) Field of Classification Search
USPC .......... 257/676, 777, E23.046, E23.124, 257/E23.052, E25.011
See application file for complete search history.

(56) References Cited

U.S. PATENT DOCUMENTS

| | | |
|---|---|---|
| 2002/0005576 A1 | 1/2002 | Sakamoto et al. |
| 2004/0021231 A1 | 2/2004 | Ishimura et al. |
| 2010/0190003 A1* | 7/2010 | Fujii et al. ............ 428/338 |
| 2012/0007234 A1* | 1/2012 | Tsai et al. ............ 257/737 |

FOREIGN PATENT DOCUMENTS

| | | |
|---|---|---|
| JP | 2001-358287 A | 12/2001 |
| JP | 2002-026233 A | 1/2002 |
| JP | 2003-318360 A | 11/2003 |

* cited by examiner

Primary Examiner — David S Blum
(74) Attorney, Agent, or Firm — Miles & Stockbridge P.C.

(57) ABSTRACT

In a QFP with a chip-stacked structure in which a lower surface of a die pad is exposed from a lower surface of a sealing member, a semiconductor chip having a BCB film, which is made of a polymeric material containing at least benzocyclobutene in its backbone as an organic monomer and formed on its surface, is mounted at a position (second stage) that is away from the die pad. As a result, even when moisture invades through the interface between the die pad and the sealing member, it is possible to prolong the time required for the moisture to reach the semiconductor chip, and subsequently to make moisture absorption defect less likely to occur.

11 Claims, 32 Drawing Sheets

SEMICONDUCTOR DEVICE

CROSS-REFERENCE TO RELATED APPLICATIONS

The present application claims priority from Japanese Patent Application No. 2011-276483 filed on Dec. 16, 2011, the content of which is hereby incorporated by reference to this application.

TECHNICAL FIELD

The present invention relates to a technique for a semiconductor device, and more particularly relates to a technique effectively applied to a semiconductor device of a die-pad exposed type.

BACKGROUND

Japanese Patent Application Laid-Open Publication No. 2001-358287 (Patent Document 1) discloses a structure of a chip-stacked semiconductor device in which a rear surface of a first semiconductor chip is exposed on the same plane as a sealing resin surface in a resin-molded state.

Also, Japanese Patent Application Laid-Open Publication No. 2003-318360 (Patent Document 2) discloses a structure of a non-lead type semiconductor device including a sealing member made of insulating resin, a tab on which a semiconductor chip is mounted, a plurality of leads, each having one surface exposed on a mounting surface of the sealing member, a first semiconductor chip supported on one surface of the tab, and a second semiconductor chip stacked and mounted on the first semiconductor chip, in which one surface of the tab is exposed on the mounting surface of the sealing member.

Moreover, Japanese Patent Application Laid-Open Publication No. 2002-26233 (Patent Document 3) discloses a structure of a semiconductor device including a first semiconductor chip and a second semiconductor chip that are mutually stacked and electrically connected with each other, in which a first die pad on which the first semiconductor chip is fixed and a second die pad on which the second semiconductor chip is fixed are provided and portions of the first die pad and the second die pad are exposed.

SUMMARY

In the case of a semiconductor device using a lead frame as a base member on which semiconductor chips (hereinafter, referred to simply as chips) are mounted (for example, QFP (Quad Flat Package)), the manufacturing cost of a semiconductor device can be reduced in comparison with that of a semiconductor device using a wiring board made up of a wiring layer and an insulating layer (for example, BGA (Ball Grid Array)).

In the QFP type semiconductor device, however, since leads serving as external terminals are arranged on the peripheral edge portion of a semiconductor device (sealing member), the outside size of the semiconductor device becomes larger (it becomes difficult to achieve the miniaturization and the increase in the number of pins) in the case where the same number of external terminals as that of the BGA type semiconductor device are to be provided.

For this reason, the inventor of the present invention has studied a structure in which a die pad (chip mounting part) on which semiconductor chips are mounted is exposed from a lower surface (mounting surface) of a sealing member sealing the semiconductor chips to use this die pad also as one of external terminals.

On the other hand, in recent years, there have been strong demands for highly functional semiconductor devices or for miniaturization of a mounting substrate on which a semiconductor device is mounted. Therefore, the inventor of the present invention has studied also a structure in which a plurality of or a plurality of types of semiconductor chips are installed in a single semiconductor device.

As a result of evaluations about the semiconductor devices having these structures, occurrence of moisture absorption defect has been observed in the semiconductor devices. According to the examinations on the cause thereof by the inventor of the present invention, it has been found that since one portion of the die pad is exposed from the sealing member, peeling occurs at the interface between the sealing member and the die pad, and moisture invades into the sealing member from the outside through a gap caused by the peeling.

It has also been found that the above-described interface peeling tends to occurs at the interface between the sealing member and the semiconductor chip having a main surface on which a certain protective film (a film made of a polymeric material containing at least benzocyclobutene in its backbone as an organic monomer, for example, a benzocyclobutene film (hereinafter, referred to also simply as a BCB film)) is formed.

Additionally, when moisture reaches the main surface of the semiconductor chip due to this moisture absorption defect, the electrode pads formed on the main surface of the semiconductor chip are contaminated. For this reason, for example, in a product in which electrode pads of the semiconductor chip and leads are electrically connected by wires, this causes separation (disconnection) of the wires from the electrode pads (degradation in reliability of a semiconductor device).

An object of the present invention is to provide a technique capable of suppressing the degradation in reliability of a semiconductor device.

The above and other objects and novel characteristics of the present invention will be apparent from the description of the present specification and the accompanying drawings.

MEANS FOR SOLVING THE PROBLEMS

The following is a brief description of an outline of the typical invention disclosed in the present application.

A semiconductor device according to a typical embodiment includes a die pad, a plurality of leads, a first semiconductor chip mounted on the die pad, a second semiconductor chip mounted on the first semiconductor chip, a plurality of first and second conductive members, and a sealing member sealing these components such that a lower surface of the die pad is exposed, and a second protective film formed on a second main surface of the second semiconductor chip is made of a polymeric material containing benzocyclobutene in its backbone as an organic monomer.

The effects obtained by typical embodiments of the invention disclosed in the present application will be briefly described below.

It is possible to suppress degradation in reliability of a semiconductor device.

DETAILED DESCRIPTION

In the embodiments described below, the description of the same or similar portions is not repeated in principle unless particularly required.

Furthermore, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Also, even when mentioning that constituent elements or the like "are made of A", "are made up of A", "are provided with A", or "include A" in the embodiments below, elements other than A are of course not excluded except the case where it is particularly specified that A is the only element thereof. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiments, and the repetitive description thereof will be omitted. Also, hatching is used even in a plan view so as to make the drawings easy to see.

First Embodiment

Figure 1:
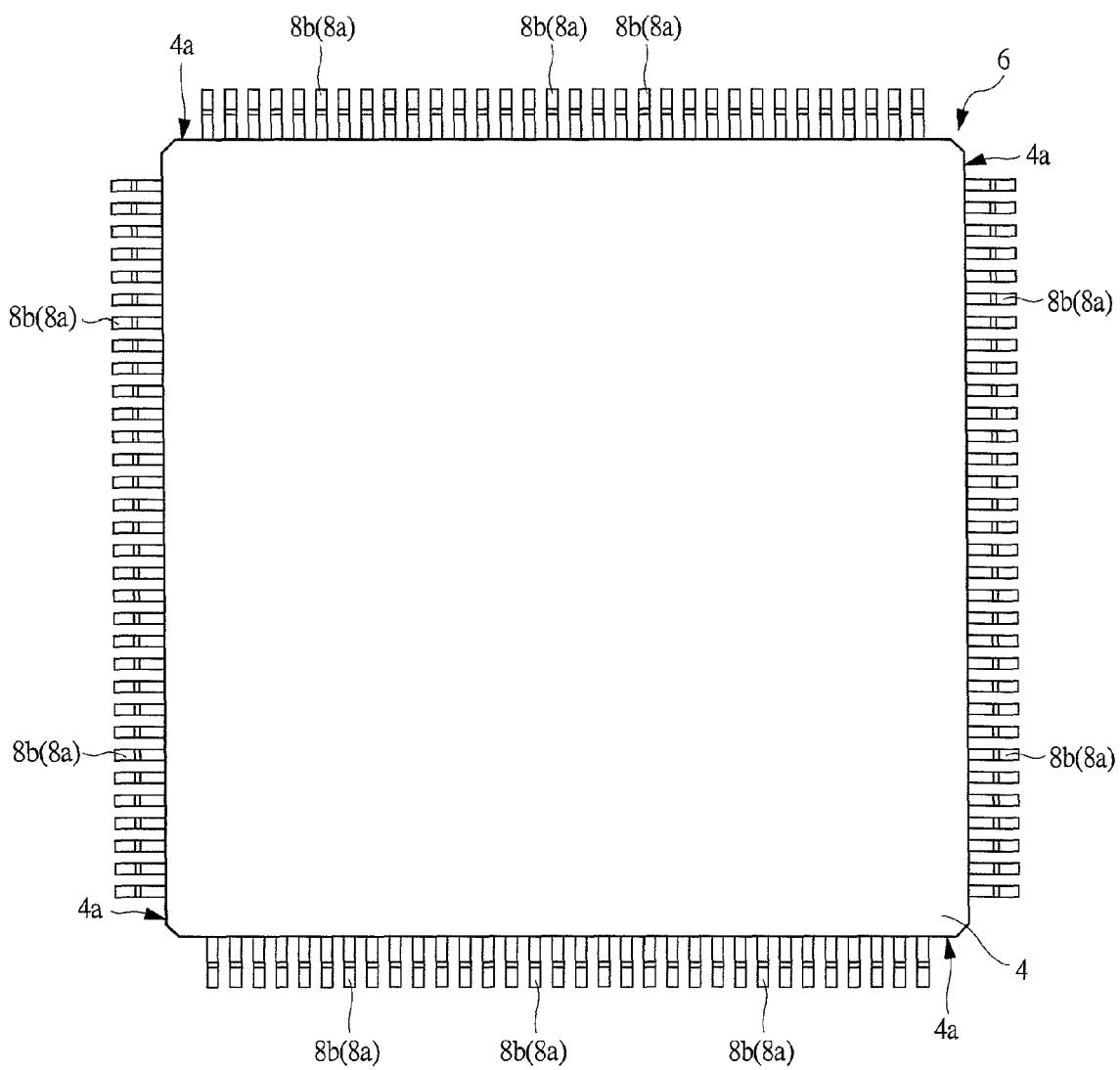
FIG. 1 is a plan view showing one example of a structure of a semiconductor device of the first embodiment of the present invention.
Figure 2:
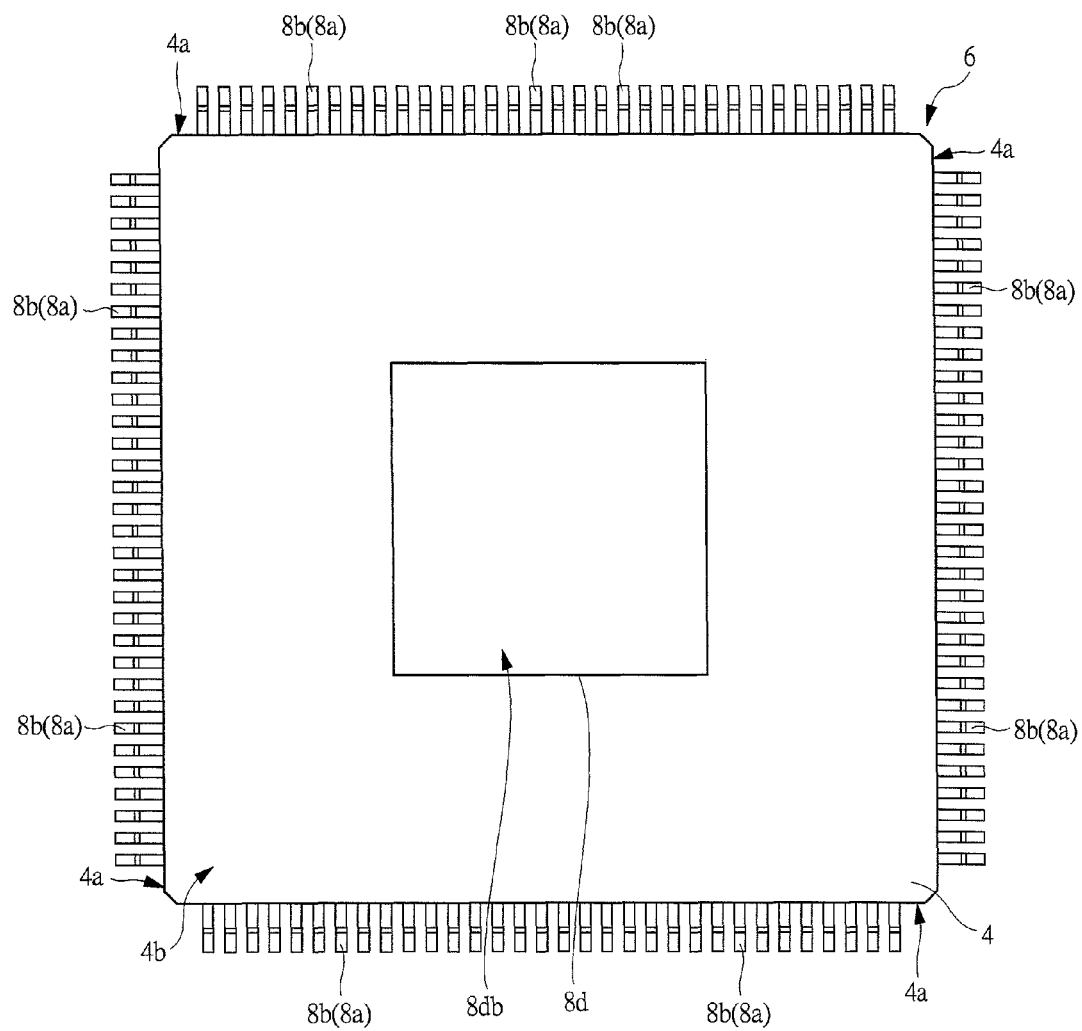
FIG. 2 is a rear-surface view showing one example of the structure of the semiconductor device of FIG. 1.
Figure 3:
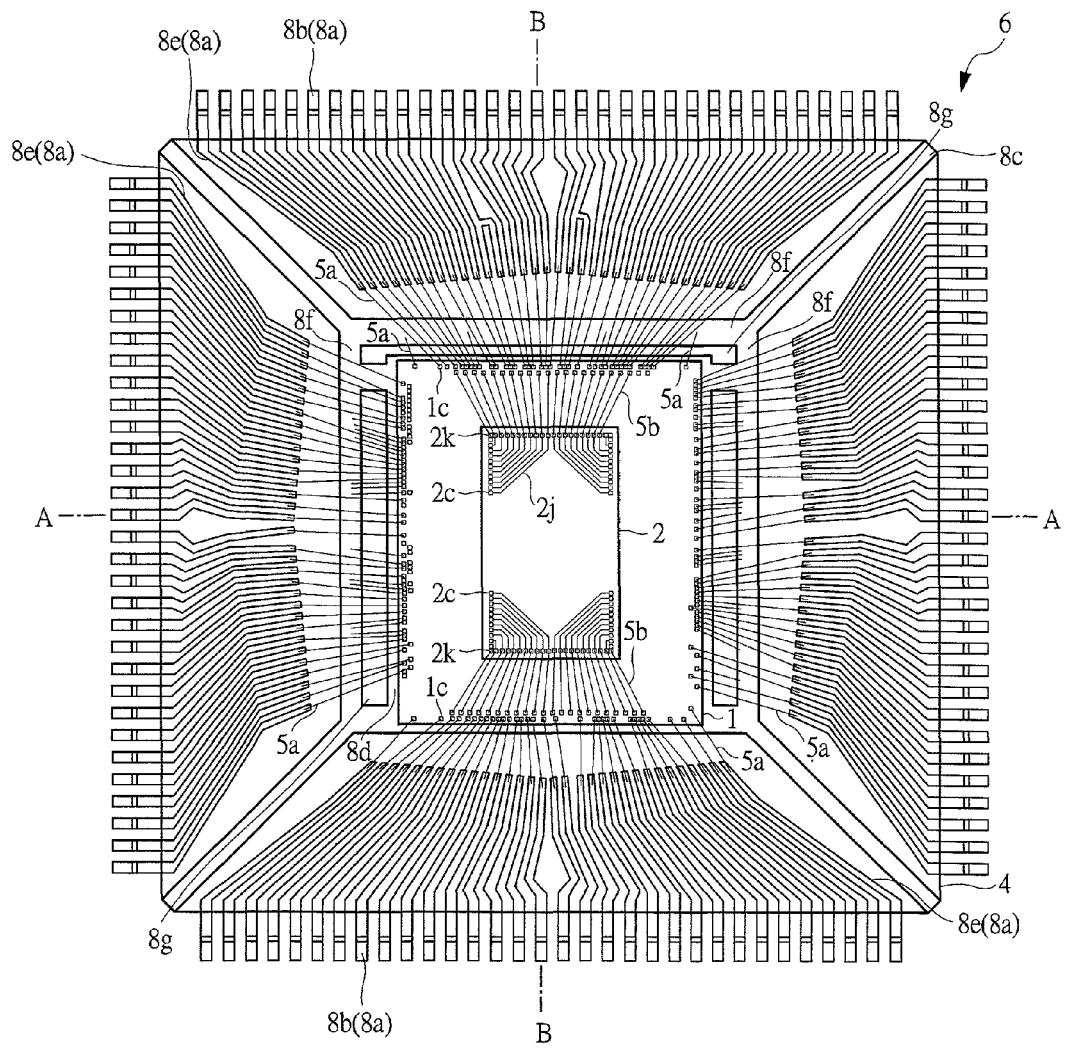
FIG. 3 is a plan view showing the structure of the semiconductor device of FIG. 1 in a transparent manner through a sealing member.
Figure 4:
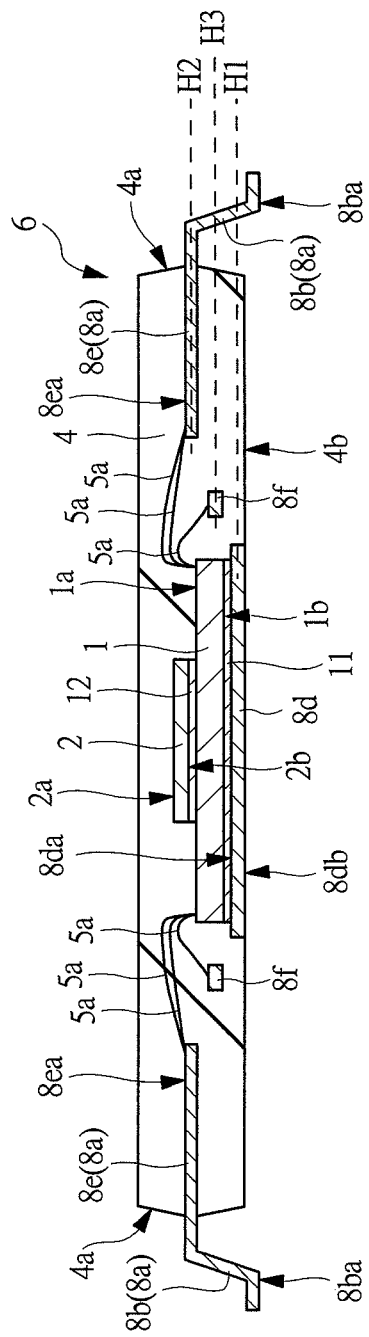
FIG. 4 is a cross-sectional view showing one example of a structure taken along the line A-A of FIG. 3.
Figure 5:
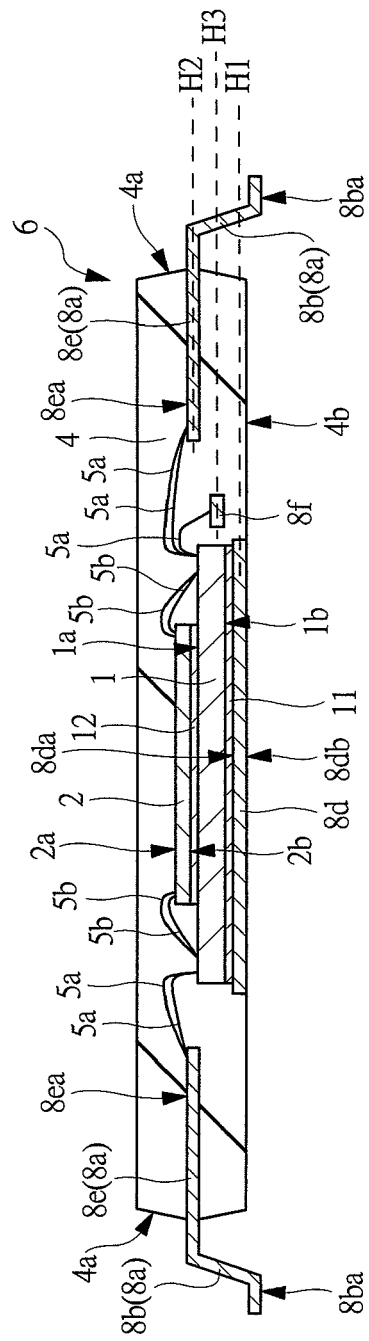
FIG. 5 is a cross-sectional view showing one example of a structure taken along the line B-B of FIG. 3.
Figure 6:
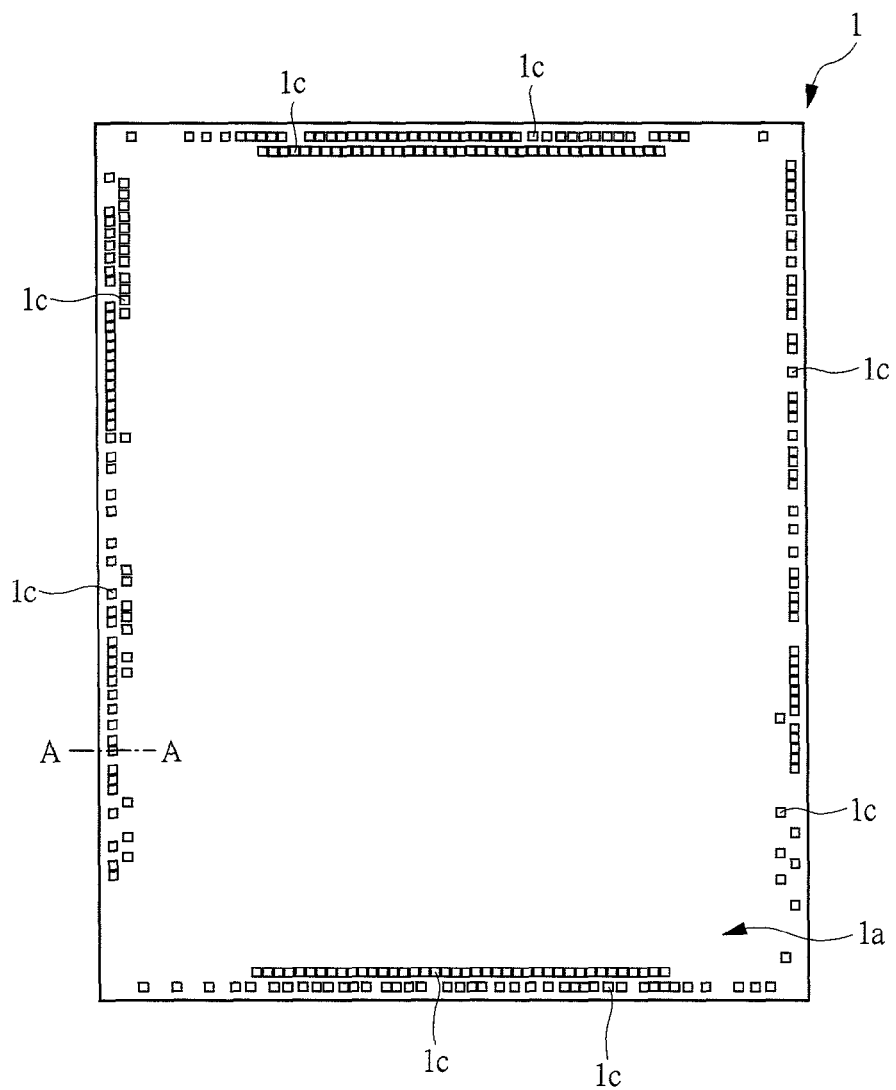
FIG. 6 is a plan view showing one example of a structure of a semiconductor chip on a first stage mounted in the semiconductor device of FIG. 1.
Figure 7:
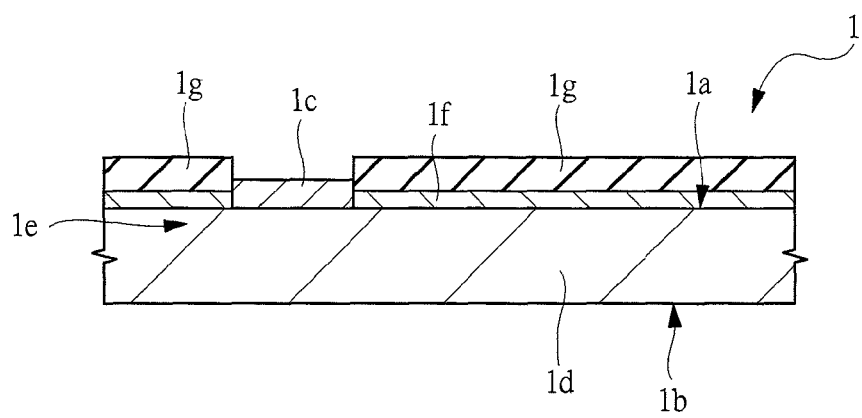
FIG. 7 is a partial cross-sectional view showing one example of a structure taken along the line A-A of FIG. 6.
Figure 8:
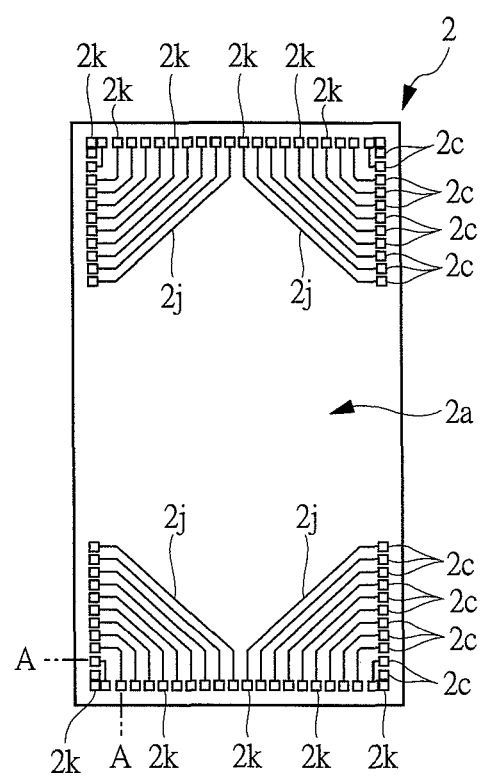
FIG. 8 is a plan view showing one example of a structure of a semiconductor chip on a second stage mounted in the semiconductor device of FIG. 1.
Figure 9:
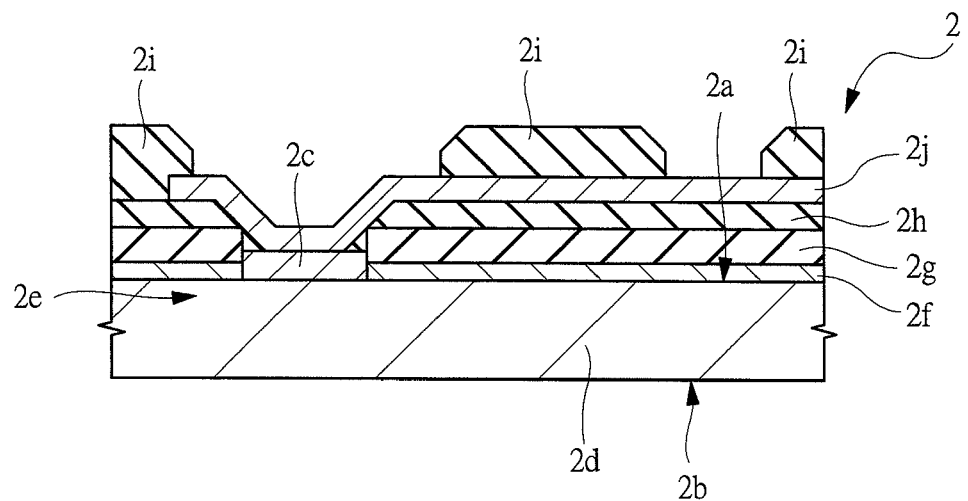
FIG. 9 is a cross-sectional view showing one example of a structure taken along the line A-A of FIG. 8.
Figure 10:
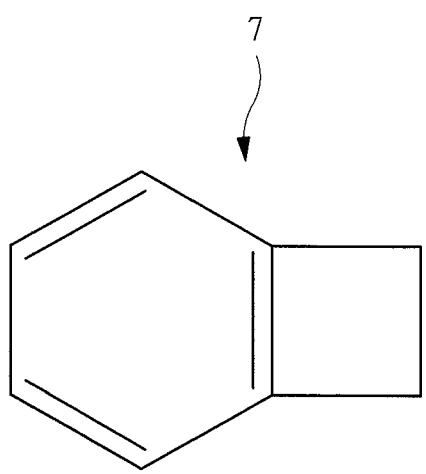
FIG. 10 is a plan view showing one example of a structural formula expressing a molecular structure of a BCB film in FIG. 9.

FIG. 1 is a plan view showing one example of a structure of a semiconductor device of the first embodiment of the present invention, FIG. 2 is a rear-surface view showing one example of the structure of the semiconductor device of FIG. 1, FIG. 3 is a plan view showing the structure of the semiconductor device of FIG. 1 in a transparent manner through a sealing member, FIG. 4 is a cross-sectional view showing one example of a structure taken along the line A-A of FIG. 3, and FIG. 5 is a cross-sectional view showing one example of a structure taken along the line B-B of FIG. 3. Also, FIG. 6 is a plan view showing one example of a structure of a semiconductor chip on a first stage mounted in the semiconductor device of FIG. 1, FIG. 7 is a partial cross-sectional view showing one example of a structure taken along the line A-A of FIG. 6, FIG. 8 is a plan view showing one example of a structure of a semiconductor chip on a second stage mounted in the semiconductor device of FIG. 1, FIG. 9 is a cross-sectional view showing one example of a structure taken along the line A-A of FIG. 8, and FIG. 10 is a plan view showing one example of a structural formula expressing a molecular structure of a BCB film in FIG. 9.

First, a structure of a semiconductor device of the present first embodiment will be described.

As shown in FIGS. 1 to 3, the semiconductor device of the present first embodiment is of a resin-sealed type in which a plurality of outer leads 8*b* serving as external terminals of a plurality of leads 8*a* protrude from side surfaces 4*a* of a sealing member 4. More specifically, the plurality of leads 8*a* are respectively exposed from the four side surfaces 4*a* of the sealing member 4. Also, each of the outer leads 8*b* is bent and formed into a gull-wing shape. Furthermore, as shown in FIG. 2, FIG. 4 and FIG. 5, one portion of a die pad 8*d* on which the semiconductor chip is mounted is exposed from a lower surface 4*b* of the sealing member 4.

Next, structures of respective components of the QFP 6 will be described in detail.

First, as shown in FIG. 3, the QFP 6 includes a die pad (tab, chip mounting part) 8*d* having a virtually square plate shape in its planar shape, a plurality of suspension leads 8*c* supporting the die pad 8*d* (coupled to the die pad 8*d*), a plurality of inner leads 8*e* arranged around the die pad 8*d* when seen in a plan view and located between the adjacent suspension leads 8*c* among the plurality of suspension leads 8*c*, and a plurality of outer leads 8*b* that are integrally continuous with the inner leads 8*e* and serve as external terminals. Also, as shown in FIG. 4, each of the inner leads 8*e* has an upper surface (wire bonding surface) 8*ea* to which wire to be described later is connected. On the other hand, each of the outer leads 8*b* has a lower surface (mounting surface) 8*ba*. In this case, the outside size of the die pad 8*d* is larger than the outside size of the semiconductor chip on the first stage. In other words, when seen in a plan view, one portion (peripheral edge portion) of the die pad 8*d* is exposed from the semiconductor chip 1 on the first stage as shown in FIG. 3. Moreover, when seen in a cross-sectional view, as shown in FIG. 4 and FIG. 5, one portion (peripheral edge portion and side surface) of the die pad 8*d* projects from the peripheral edge portion (side surface) of the semiconductor chip 1 on the first stage.

Also, in the QFP 6, as shown in FIGS. 3 to 5, the semiconductor chip 1 is mounted on the upper surface (chip mounting surface) 8*da* of the die pad 8*d* with its face up with a die bonding material 11 interposed therebetween, and a semiconductor chip 2 is mounted on the semiconductor chip 1 with its face up in the same manner with a die bonding material 12 interposed therebetween.

More specifically, the semiconductor chip 1 has a surface 1*a* and a rear surface 1*b* opposite to the surface 1*a*, and is mounted on the die pad 8*d* such that its rear surface 1*b* faces the upper surface 8*da* of the die pad 8*d*. On the other hand, the semiconductor chip 2 also has a surface 2*a* and a rear surface 2*b* opposite to the surface 2*a*, and is mounted on the semiconductor chip 1 such that its rear surface 2*b* faces the surface 1*a* of the semiconductor chip 1. Thus, the QFP 6 of the present first embodiment forms a chip-stacked semiconductor package in which the two semiconductor chips 1 and 2 are stacked on the die pad 8*d*.

As shown in FIG. 6 and FIG. 7, the semiconductor chip 1 on the lower stage side has a plurality of electrode pads (bonding pads) 1*c* formed on its surface 1*a* and a semiconductor element (circuit element) 1*e* (not shown) formed therein. The plurality of electrode pads is are electrically connected to the semiconductor element 1*e*.

On the other hand, as shown in FIG. 8 and FIG. 9, the semiconductor chip 2 on the upper stage side has a plurality of electrode pads 2*c* formed on its surface 2*a* and a semiconductor element (circuit element) 2*e* (not shown) formed therein that is different from the above-mentioned semiconductor element 1*e*. The plurality of electrode pads 2*c* are electrically connected to the semiconductor element 2*e*.

Moreover, in the QFP 6, the die pad 8*d* is used as an external terminal formed into a common terminal, and the QFP 6 is of a die-pad exposed type in which one portion (lower surface 8*db*, mounting surface) of the die pad 8*d* is exposed from the sealing member 4. Therefore, as shown in FIG. 2, FIG. 4 and FIG. 5, the sealing member 4 made of sealing resin is designed to seal the die pad 8*d*, the semiconductor chip 1, the semiconductor chip 2, and the plurality of wires 5*a* and 5*b* such that the lower surface 8*db* of the die pad 8*d* is exposed.

In this case, in the QFP 6 of the present first embodiment, the semiconductor chip 1 on the first stage mounted on the die pad 8*d* is, for example, a controller chip (DSP (Digital Signal Processor)). On the other hand, the semiconductor chip 2 on the second stage stacked on the semiconductor chip 1 is, for example, an SDRAM (Synchronous Dynamic Random Access Memory). Moreover, the semiconductor chip 1 exchanges signals between the QFP 6 and the outside, and carries out certain controls in the semiconductor chip 2. More specifically, the QFP 6 is also an SIP (System In Package) type semiconductor device. Therefore, since the controller chip (semiconductor chip 1) has many functions including an internal interface and an external interface, it has more terminals (more number of pads) in comparison with a memory chip (semiconductor chip 2) such as an SDRAM.

Thus, as shown in FIG. 3, a plurality of electrode pads 1*c* of the semiconductor chip 1 are formed along each of four sides of a square-shaped surface 1a when seen in a plan view. Also, a plurality of inner leads (leads 8a) 8e are respectively arranged along the four sides of the surface 1a of the semiconductor chip 1. More specifically, the plurality of electrode pads 1c are formed along the four sides of the surface 1a of the semiconductor chip 1 such that the plurality of electrode pads is formed on the surface 1a are easily wire-connected to the plurality of inner leads 8e formed on the periphery of the semiconductor chip 1, respectively.

On the other hand, in the semiconductor chip 2 on the second stage, a plurality of rearrangement pads 2k (portions of a wiring layer 2j to which wires 5b are connected) are formed along only two opposed sides. The plurality of rearrangement pads 2k are electrically connected to the plurality of electrode pads 2c, respectively. More specifically, the wires 5b are electrically connected to the electrode pads 2c through the wiring layer 2j. The rearrangement pads 2k of the semiconductor chip 2 will be described later in detail.

As shown in FIG. 3 and FIG. 6, out of the plurality of electrode pads 1c of the semiconductor chip 1, the plurality of electrode pads 1c arranged along the side in parallel with the side of the semiconductor chip 2 on which the plurality of rearrangement pads 2k are formed are arranged in at least two rows. In other words, out of the plurality of electrode pads is arranged in these two rows, the plurality of electrode pads 1c arranged on the outer side are electrically connected to the plurality of inner leads 8e through the plurality of wires 5a respectively, and in contrast, the plurality of electrode pads 1c arranged on the inner side of the two rows are electrically connected to the plurality of rearrangement pads 2k of the semiconductor chip 2 on the upper stage side through the plurality of wires 5b, respectively.

Furthermore, in the QFP 6, as shown in FIG. 3, four suspension leads 8c supporting the die pad 8d are formed so as to extend from the die pad 8d, that is, from the center portion of the QFP 6 toward the respective corners (along diagonal lines of the QFP 6). Moreover, bar leads 8f (referred to also as bus bars) are arranged between adjacent suspension leads 8c of the four suspension leads 8c, and are also placed between the die pad 8d and the plurality of inner leads (leads 8a) 8e when seen in a plan view.

In other words, the bar leads 8f are formed between the plurality of inner leads 8e and the die pad 8d with slit-shaped openings 8g interposed therebetween when seen in a plan view. Each bar lead 8f is integrally formed together with the suspension lead 8c, and is also integrally connected to the die pad 8d serving as a common terminal through a connecting part 8h (see FIG. 12). Therefore, in the case when the die pad 8d is used as a common terminal for a power supply potential, a reference potential or the like, the bar lead 8f also has the same power supply potential or reference potential.

Therefore, by the down bonding of the plurality of electrode pads is for a reference potential (hereinafter, referred to as GND) of the semiconductor chip 1 and the bar leads 8f through the wires 5a at plural positions, the number of external terminals (outer leads 8b) for GND can be reduced.

In other words, by reducing the number of the external terminals for GND, the number of the outer leads 8b is reduced, so that the QFP 6 can be miniaturized. Moreover, by reducing the number of the external terminals for GND, the corresponding reduced number of external terminals can be assigned to terminals for other functions, and consequently, it becomes possible to achieve a highly functional (highly integrated) QFP 6.

As shown in FIG. 4 and FIG. 5, each of the bar leads 8f is disposed at a position (height) H3 between a height H1 at which the die pad 8d is located and a height H2 at which the leads (inner leads 8e) are positioned when seen in a cross-sectional view.

Figure 12:
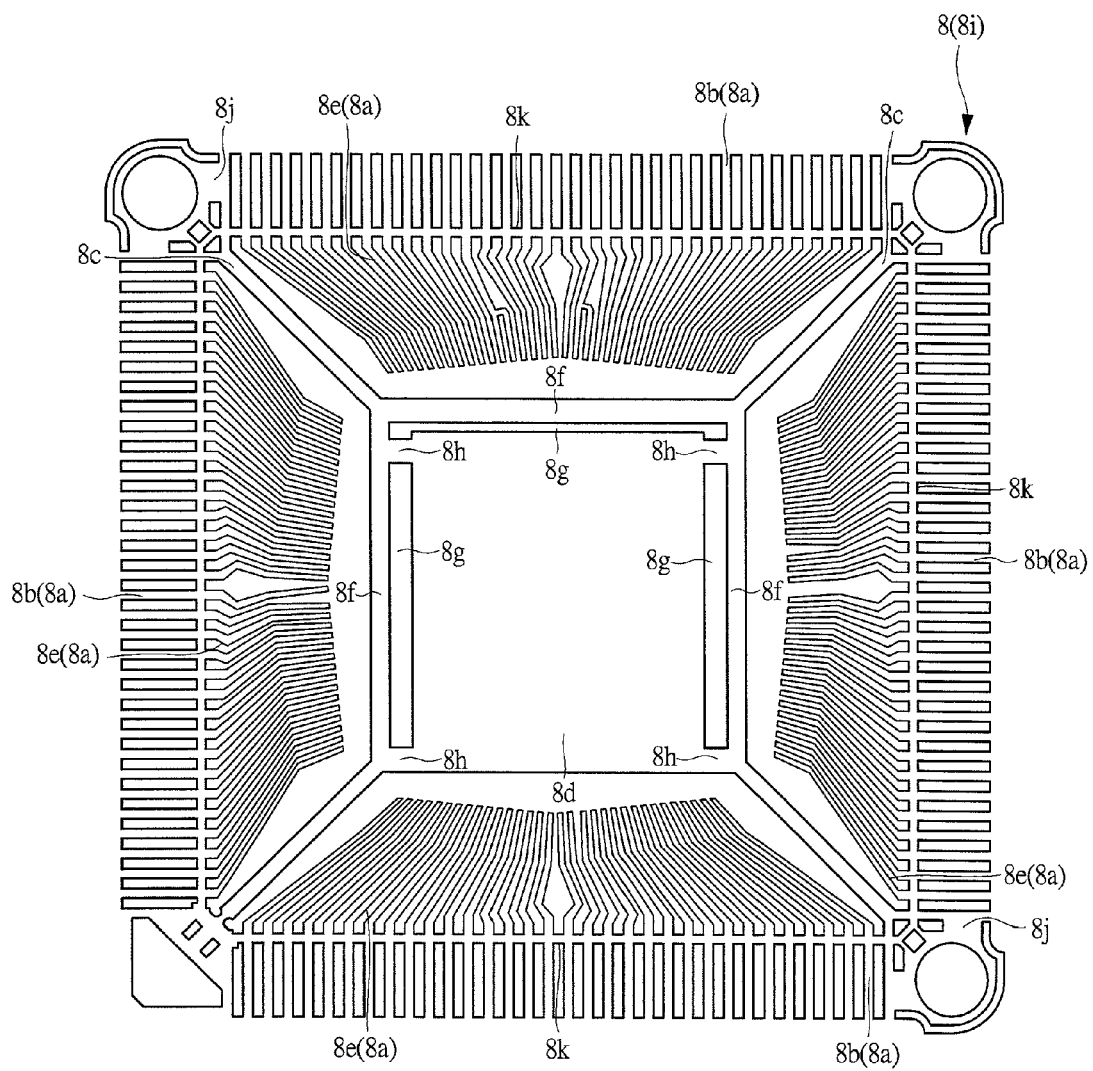
FIG. 12 is a partial plan view showing one example of a structure of a device area in the lead frame of FIG. 1.

This structure is achieved by carrying out a bending process on the connecting parts 8h shown in FIG. 12 at which the die pad 8d and the bar leads 8f are coupled with each other so as to set the height of the bar leads 8f between the height of the die pad 8d and the height of the inner leads 8e.

In this manner, at the time when a down bonding process is carried out on the bar leads 8f, the position of the $2^{nd}$ bonding can be raised so as to be closer to the height of the chip surface, and as a result, the wire connectivity in the down bonding process can be improved.

In this case, the semiconductor chips 1 and 2 are made of, for example, silicon (Si). Moreover, the plurality of leads 8a composed of the inner leads 8e and the outer leads 8b, the die pad 8d, the plurality of suspension leads 8c, and the bar leads 8f are made of, for example, metal such as copper (Cu). Also, the wires 5a and 5b are made of, for example, gold (Au) or copper (Cu). Moreover, the sealing member 4 is made of, for example, epoxy-based thermosetting resin.

Next, the semiconductor chips 1 and 2 to be mounted on the QFP 6 will be described.

In the QFP 6 of the present first embodiment, the semiconductor chip 1 to be mounted on the first stage is a controller chip, and since it has a large number of pads (terminals) as described above, the plurality of electrode pads 1c are allocated and arranged on the respective four sides as shown in FIG. 6. Moreover, as shown in FIG. 7, the semiconductor chip 1 has a silicon substrate 1d, a silicon nitride film (SiN) if formed on a surface 1a of the silicon substrate 1d, and a polyimide film (protective film, insulating film) 1g formed on the silicon nitride film if such that the plurality of electrode pads 1c for bonding are exposed.

On the other hand, the semiconductor chip 2 on the second stage stacked on the semiconductor chip 1 is an SDRAM, and as shown in FIG. 8, this SDRAM includes a plurality of electrode pads 2c, rearrangement wires (wiring layer) 2j that are electrically connected to these electrode pads 2c, and rearrangement pads 2k that are electrically connected to the rearrangement wires 2j. Also, the rearrangement pads 2k are made of one portion of the rearrangement wires (wiring layer) 2j. Moreover, the plurality of rearrangement pads 2k are formed on two sides opposed to each other, and in the present embodiment, these are respectively formed along the two shorter sides of the semiconductor chip 2 having a rectangular planar shape. Also, as shown in FIG. 9, the semiconductor chip 2 includes a silicon substrate 2d, a silicon nitride film (SiN) 2f formed on a surface 2a of the silicon substrate 2d, a polyimide film 2g formed on the silicon nitride film 2f such that the plurality of electrode pads 2c are exposed, and a BCB film (protective film, insulating film) 2h that is formed on the polyimide film 2g such that the plurality of electrode pads 2c are exposed and is different from the polyimide films 1g and 2g. Furthermore, as described above, the plurality of electrode pads 2c, the rearrangement wires (wiring layer) 2j that are electrically connected to these electrode pads 2c, the rearrangement pads 2k made of one portion of the rearrangement wires 2j, and a BOB film (protective film, insulating film) 2i that is formed on the rearrangement wires 2j such that the plurality of electrode pads 2c and the rearrangement pads 2k are exposed are formed on the surface 2a of the silicon substrate 2d. In addition, in the present embodiment, a three-layer structure including the silicon nitride film 2f, the polyimide film 2g and the BCB film 2h has been exemplified as the insulating film to be disposed between the surface 2a of the silicon substrate 2d and the rearrangement wires 2j, but the insulating film is not limited to this structure, and the polyimide film 2g may not be disposed. Moreover, the present embodiment has been described by exemplifying a structure in which the plurality of electrode pads 2c and rearrangement pads 2k are exposed from the BCB film 2i, but these may be covered with the BCB film 2i except for the rearrangement pads 2k.

In this case, the BOB films 2h and 2i are films made of a polymeric material containing at least benzocyclobutene 7 expressed by a structural formula of FIG. 10 in its backbone as an organic monomer. Here, the benzocyclobutene 7 is one kind of polycyclic aromatic hydrocarbons, and it is formed by bonding cyclobutane to a benzene ring and can be used as an insulating film having low dielectric constant. On the other hand, the polyimide which forms the polyimide films 1g and 2g is a polymeric material having an imide bond in its main chain.

Also, the BOB films 2h and 2i have characteristics that the adhesive strength thereof to resin is low in comparison with a polyimide film and the dielectric constant thereof is also low in comparison with a polyimide film. Therefore, it is more effective to adopt the BOB films 2h and 2i as the insulating films to be disposed between the wires at the place where the wires are formed with a high density.

In the semiconductor chip 2 (SDRAM) of the present first embodiment, as shown in FIG. 8, the plurality of rearrangement wires 2j are formed on the surface 2a with a high density. These rearrangement wires 2j are made of, for example, gold (Au), and serve as lead-out wires for leading out the respective electrode pads 2c to the corresponding rearrangement pads 2k, and therefore, they have a long length. In other words, since the rearrangement wires 2j made of gold and having a long length are arranged on the surface 2a of the semiconductor chip 2 side by side at narrow intervals with a high density, in the case when an insulating film whose dielectric constant is not low is used as the insulating film covering the rearrangement wires 2j, the conductor loss of the rearrangement wires 2j becomes greater, and the characteristics of the semiconductor chip 2 are degraded.

However, by adopting the BCE films 2h and 2i as the insulating films covering the rearrangement wires 2j of the semiconductor chip 2 like in the case of the QFP 6 of the present first embodiment, the conductor loss in the rearrangement wires 2j can be kept at a low level, and the loss of the signals passing through the rearrangement wires 2j can be reduced, thereby suppressing the degradation of the characteristics of the semiconductor chip 2.

In the semiconductor chip 2 shown in FIG. 9, a structure in which two types of insulating films, that is, the BCB film 2h and the polyimide film 2g are arranged as the insulating films disposed between the rearrangement wires 2j and the silicon nitride film 2f has been exemplified. However, only the BCB film may be disposed between the rearrangement wires 2j and the silicon nitride film 2f.

Next, the reason why the rearrangement wires 2j are formed in the semiconductor chip 2 (SDRAM) of the QFP 6 of the present first embodiment will be described.

The SDRAM (semiconductor chip 2) is a memory that is basically adaptable to various controller chips (semiconductor chip 1), but since the position of a memory interface of the controller chip differs variously depending on the type of chips, the QFP 6 of the present first embodiment utilizes a technique in which the position of the pad (surface electrode) is rearranged on the SDRAM side. More specifically, positions of the pads for wire bonding in the SDRAM are rearranged in accordance with the position of the memory interface of the controller chip (semiconductor chip 1) to be used.

Therefore, in the QFP 6 of the present first embodiment, the positions of the electrode pads 2c of the SDRAM (semiconductor chip 2) are changed in accordance with the position of the memory interface of the controller chip (semiconductor chip 1). In other words, in the SDRAM (semiconductor chip 2), (some of) a plurality of rearrangement pads 2k which are bonding pads for wire bonding are formed along only two opposed sides as shown in FIG. 8 so as to correspond to any two opposed sides on the square-shaped surface 1a of the semiconductor chip 1. More specifically, the plurality of electrode pads 2c are respectively rearranged at positions of the plurality of rearrangement pads 2k by the plurality of rearrangement wires 2j so that the electrode pads 1c of the semiconductor chip 1 and the rearrangement pads 2k of the semiconductor chip 2 as well as the electrode pads 1c of the semiconductor chip 1 and the inner leads 8e can be easily connected to each other by wire bonding.

As described above, in the QFP 6 of the present first embodiment, the rearrangement wires 2j are formed on the SDRAM (semiconductor chip 2), and the BCB films 2h and 2i are therefore used as insulating films covering these rearrangement wires 2j.

However, as described above, the BCB films 2h and 2i have a characteristic that the adhesive strength thereof to resin is low in comparison with a polyimide film. Since the QFP 6 of the present first embodiment is of a die-pad exposed type, moisture tends to invade from the interface between the die pad 8d and the resin to cause moisture absorption defect due to the interface peeling.

However, since the SDRAM (semiconductor chip 2) on which the BCB films 2h and 2i having low adhesive strength to resin are formed is disposed on the upper stage side (near the center in the height direction of the sealing member 4), the position of the SDRAM (semiconductor chip 2) can be spaced away from the die pad 8d having a high possibility of causing the interface peeling, and the margin against the moisture absorption defect in the QFP 6 can be increased.

Next, a method for manufacturing the QFP (semiconductor device) 6 of the present first embodiment will be described.

Figure 11:
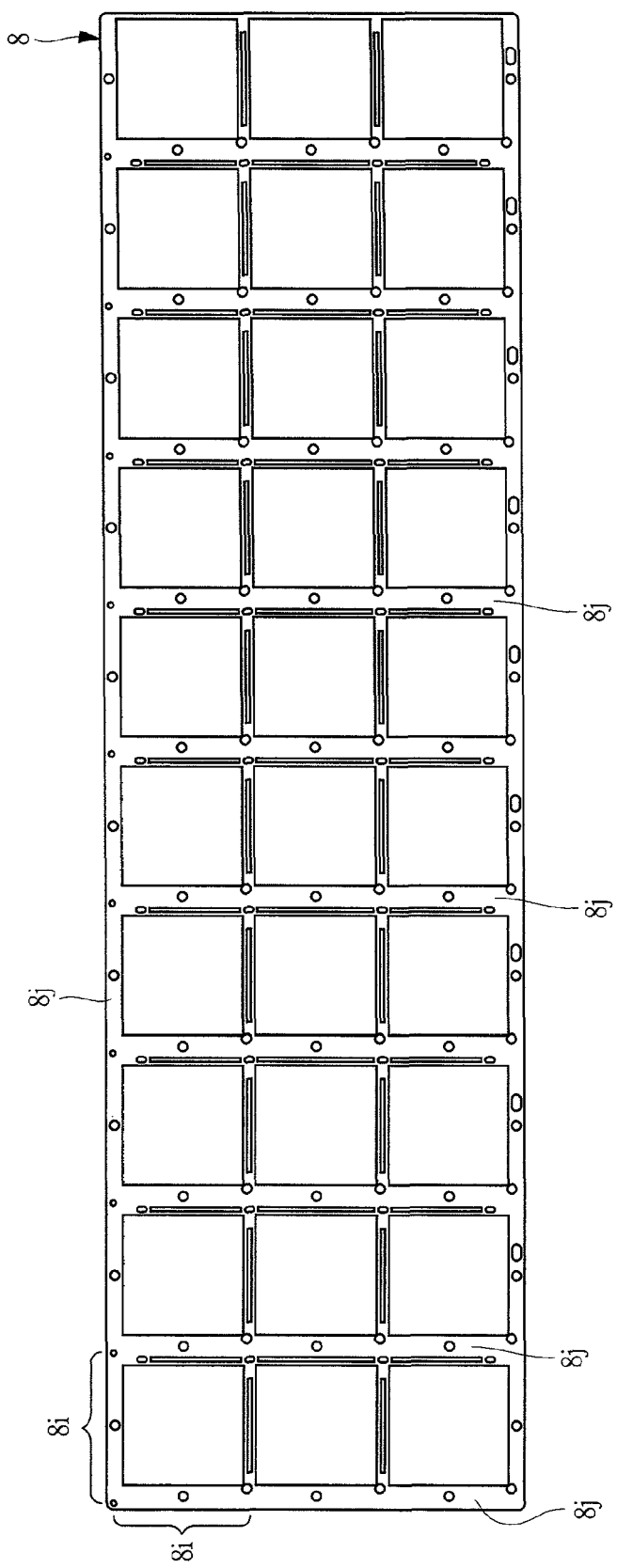
FIG. 11 is a plan view showing one example of a structure of a lead frame to be used in an assembling process of the semiconductor device of FIG. 1.
Figure 13:
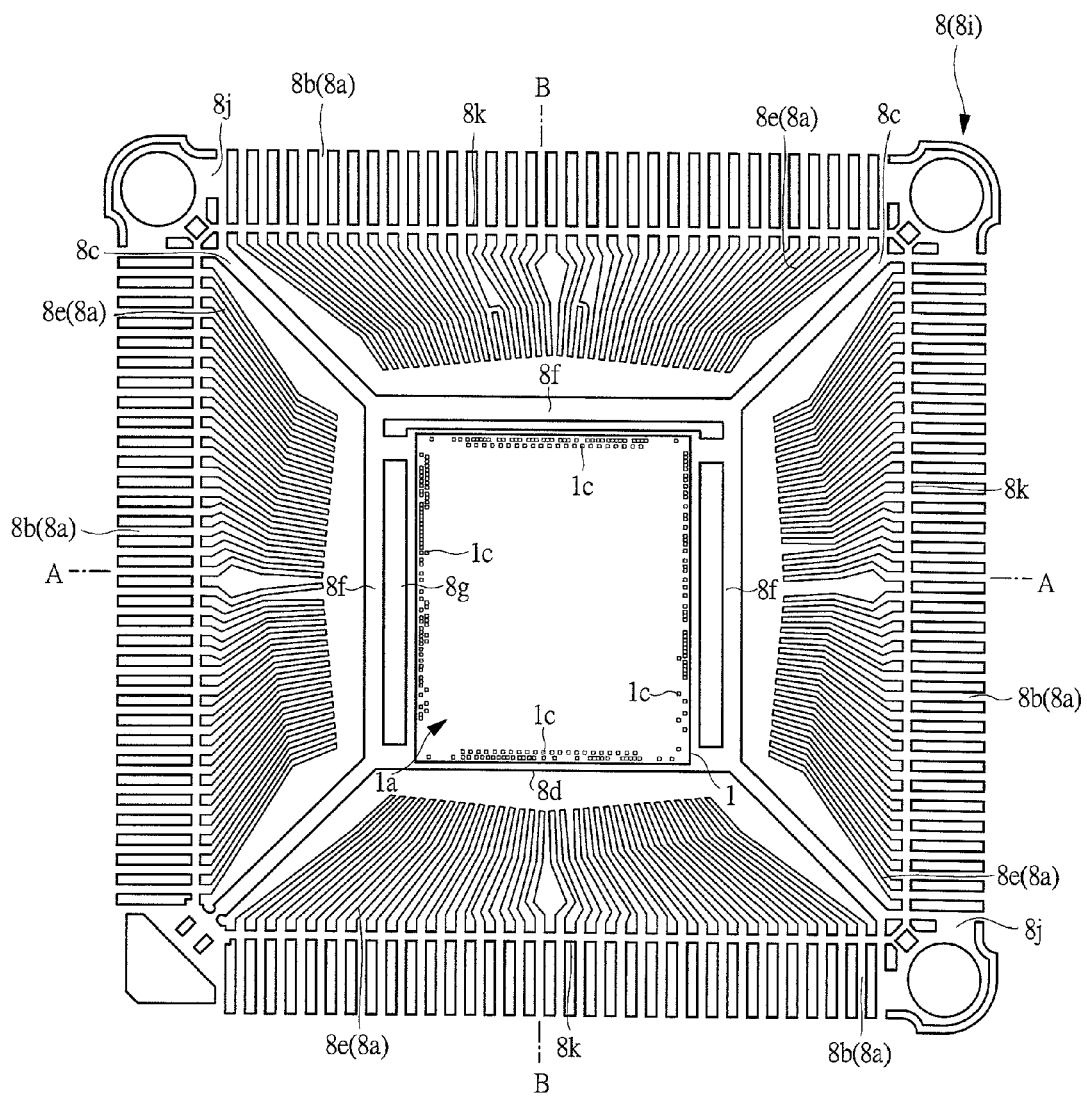
FIG. 13 is a partial plan view showing one example of a structure after die bonding of the first-stage chip in the assembling process of the semiconductor device of FIG. 1.
Figure 14:
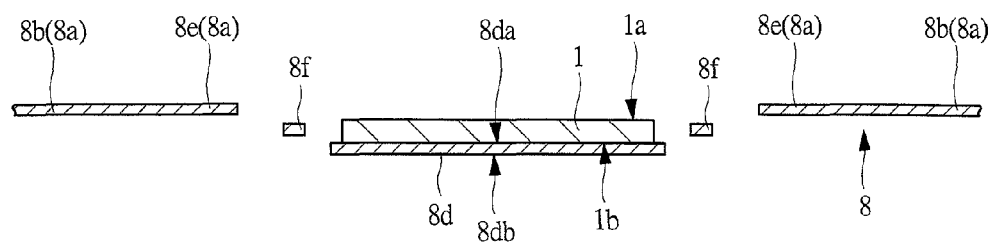
FIG. 14 is a cross-sectional view showing one example of a structure taken along the line A-A of FIG. 13.
Figure 15:
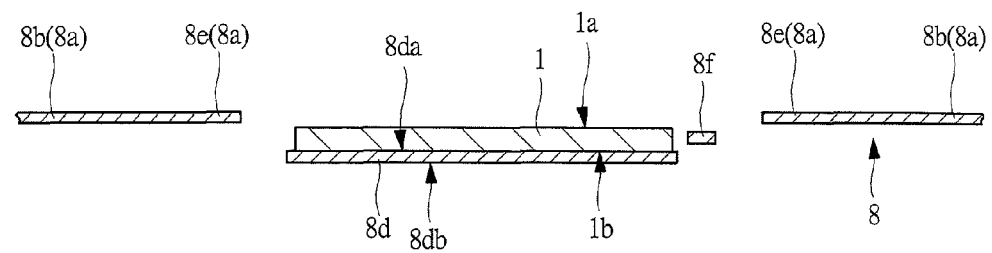
FIG. 15 is a cross-sectional view showing one example of a structure taken along the line B-B of FIG. 13.
Figure 16:
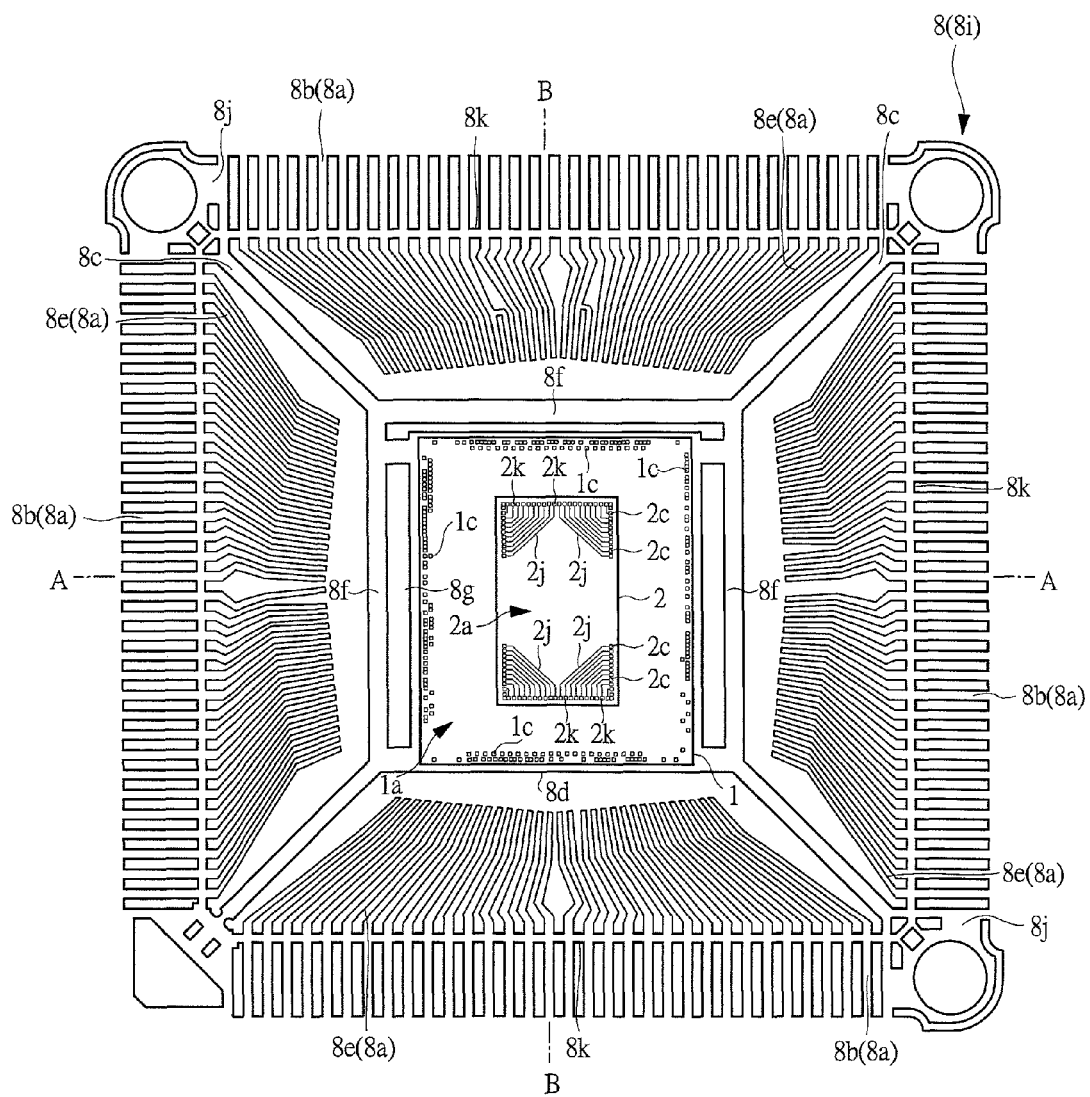
FIG. 16 is a partial plan view showing one example of a structure after die bonding of the second-stage chip in the assembling process of the semiconductor device of FIG. 1.
Figure 17:
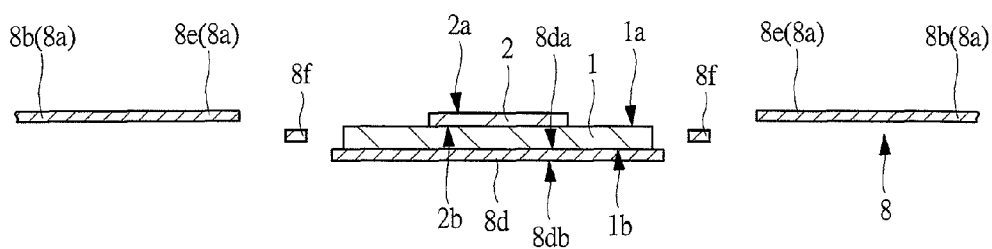
FIG. 17 is a cross-sectional view showing one example of a structure taken along the line A-A of FIG. 16.
Figure 18:
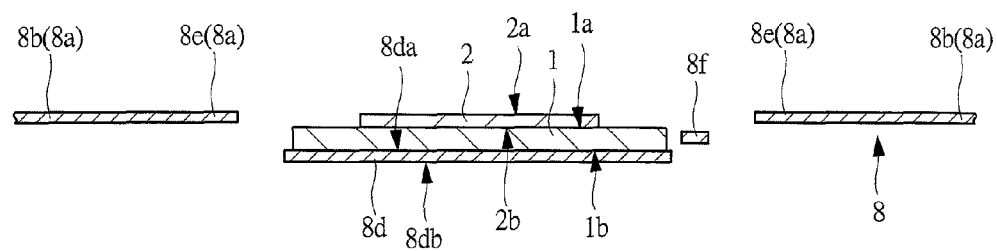
FIG. 18 is a cross-sectional view showing one example of a structure taken along the line B-B of FIG. 16.
Figure 19:
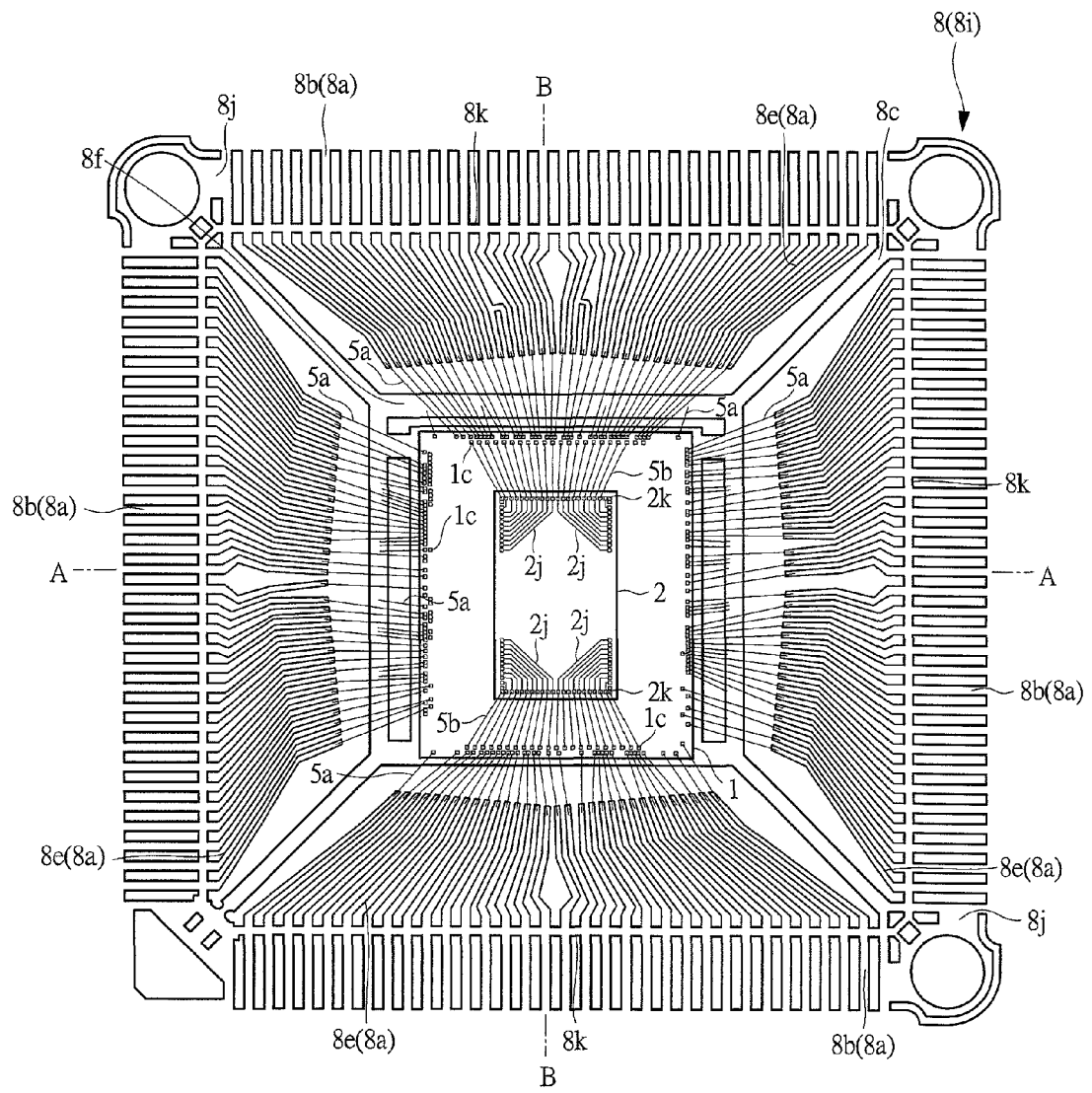
FIG. 19 is a partial plan view showing one example of a structure after wire bonding in the assembling process of the semiconductor device of FIG. 1.
Figure 20:
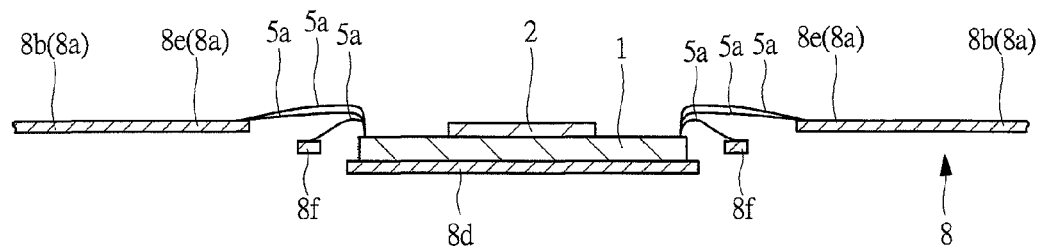
FIG. 20 is a cross-sectional view showing one example of a structure taken along the line A-A of FIG. 19.
Figure 21:
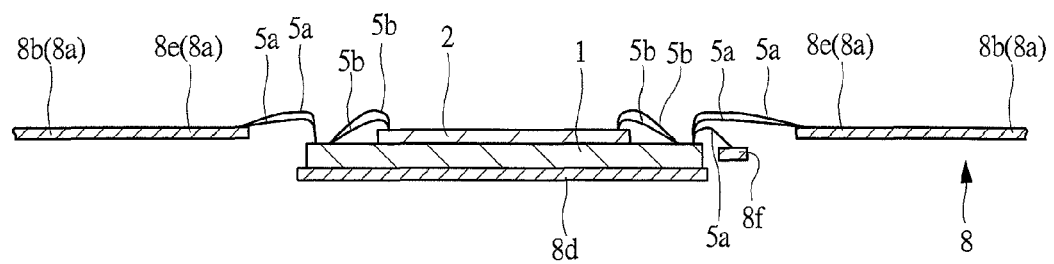
FIG. 21 is a cross-sectional view showing one example of a structure taken along the line B-B of FIG. 19.
Figure 22:
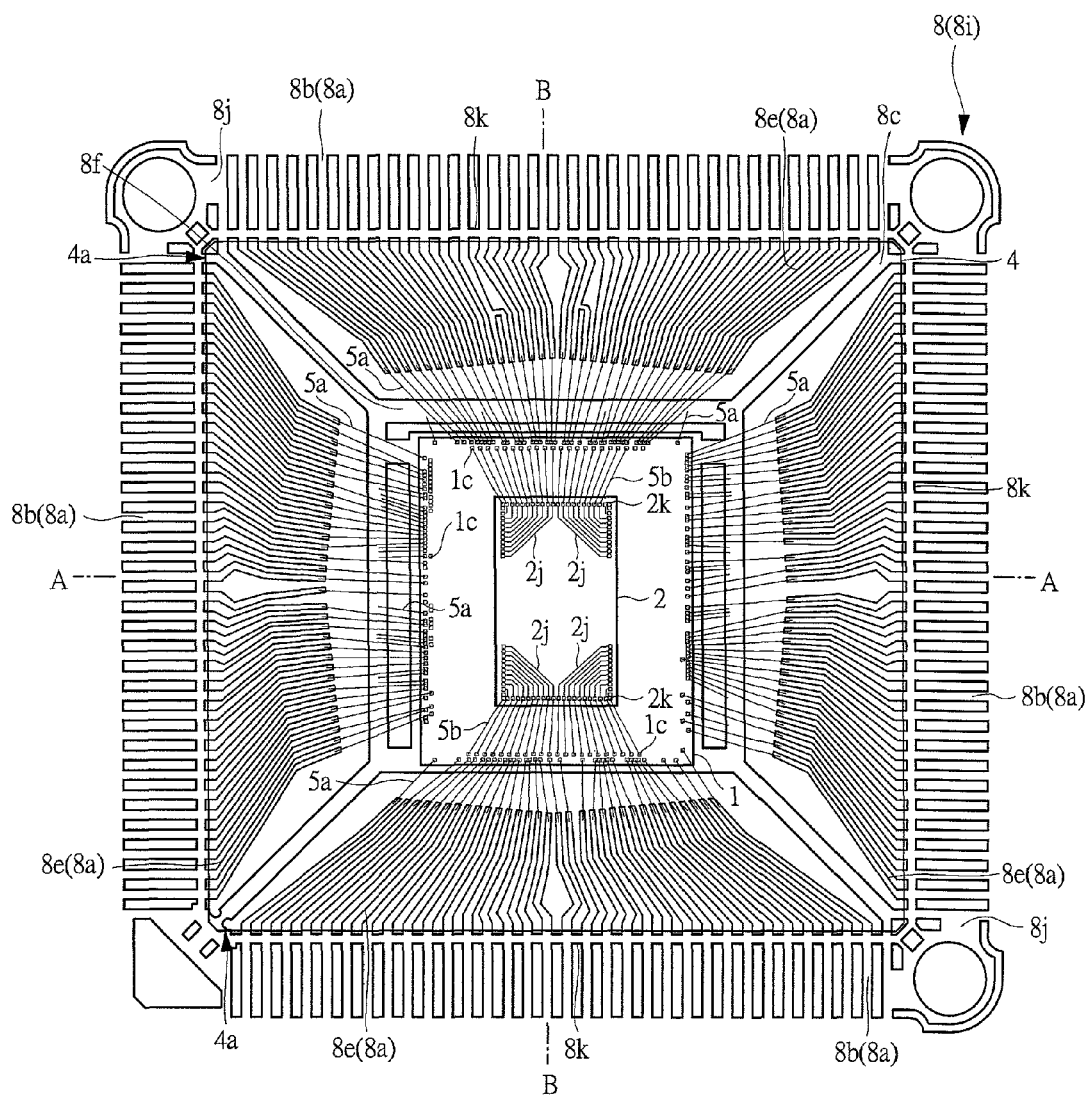
FIG. 22 is a partial plan view showing one example of a structure after resin molding in the assembling process of the semiconductor device of FIG. 1.
Figure 23:
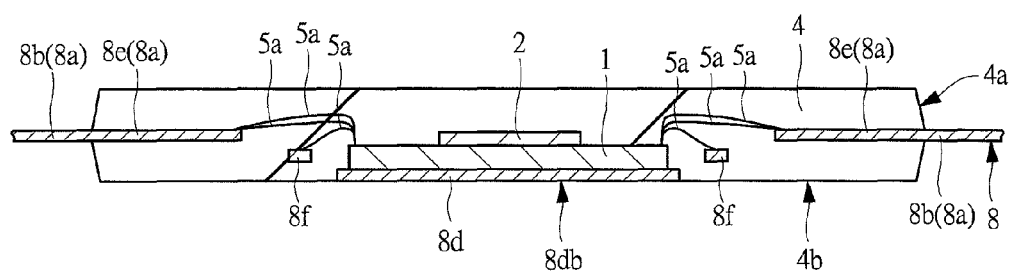
FIG. 23 is a cross-sectional view showing one example of a structure taken along the line A-A of FIG. 22.
Figure 24:
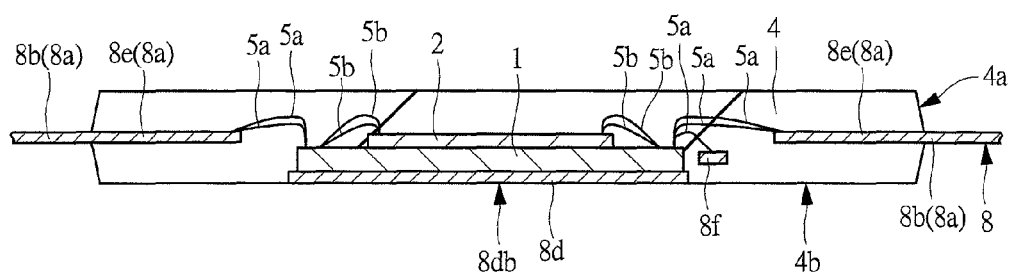
FIG. 24 is a cross-sectional view showing one example of a structure taken along the line B-B of FIG. 22.

FIG. 11 is a plan view showing one example of a structure of a lead frame to be used in an assembling process of the semiconductor device of FIG. 1, and FIG. 12 is a partial plan view showing one example of a structure of a device area in the lead frame of FIG. 1. Also, FIG. 13 is a partial plan view showing one example of a structure after die bonding of the first-stage chip in the assembling process of the semiconductor device of FIG. 1, FIG. 14 is a cross-sectional view showing one example of a structure taken along the line A-A of FIG. 13, and FIG. 15 is a cross-sectional view showing one example of a structure taken along the line B-B of FIG. 13. Furthermore, FIG. 16 is a partial plan view showing one example of a structure after die bonding of the second-stage chip in the assembling process of the semiconductor device of FIG. 1, FIG. 17 is a cross-sectional view showing one example of a structure taken along the line A-A of FIG. 16, FIG. 18 is a cross-sectional view showing one example of a structure taken along the line B-B of FIG. 16, and FIG. 19 is a partial plan view showing one example of a structure after wire bonding in the assembling process of the semiconductor device of FIG. 1. Moreover, FIG. 20 is a cross-sectional view showing one example of a structure taken along the line A-A of FIG. 19, FIG. 21 is a cross-sectional view showing one example of a structure taken along the line B-B of FIG. 19, FIG. 22 is a partial plan view showing one example of a structure after resin molding in the assembling process of the semiconductor device of FIG. 1, FIG. 23 is a cross-sectional view showing one example of a structure taken along the line A-A of FIG. 22, and FIG. 24 is a cross-sectional view showing one example of a structure taken along the line B-B of FIG. 22.

First, a thin-plate shaped lead frame 8 in which a plurality of device areas 8i are continuously formed as shown in FIG. 11 is prepared. Each of the device areas 8i is an area in which one QFP 6 is formed, and in the present first embodiment, the assembling process of the QFP 6 is described with reference to the drawings showing one device area 8i for the sake of convenience.

As shown in FIG. 12, in each of the device areas 8i, one die pad (chip mounting part) 8d, a plurality of suspension leads 8c supporting this die pad 8d, a plurality of inner leads 8e that are arranged around the die pad 8d and also located between the adjacent suspension leads 8c among the plurality of suspension leads 8c, and a plurality of outer leads 8b formed integrally with the inner leads 8e are formed.

Moreover, on the periphery of the die pad 8d, bar leads 8f connected to the die pad 8d by connecting parts 8h are formed with openings 8g interposed therebetween. The bar leads 8f are integrally connected also to the suspension leads 8c.

Also, as shown in FIG. 11 and FIG. 12, each of the device areas 8i is surrounded by a frame portion 8j, and the plurality of outer leads 8b and the plurality of suspension leads 8c are supported by the frame portion 8j.

Moreover, the lead frame 8 is made of, for example, metal such as copper (Cu).

First, the thin plate-shaped lead frame 8 having the above-mentioned plurality of device areas 8i is prepared.

Thereafter, a die bonding process is carried out. In the die bonding process, first, as shown in FIGS. 13 to 15, a controller chip serving as the semiconductor chip 1 on the first stage is mounted on the die pad 8d, and as shown in FIGS. 16 to 18, an SDRAM serving as the semiconductor chip 2 on the second stage is then mounted (stacked) on the semiconductor chip 1.

At this time, both of the semiconductor chip 1 and the semiconductor chip 2 are mounted with their faces up so that surfaces 1a and 2a thereof face upward. In other words, the semiconductor chip 1 is first mounted on the upper surface 8da of the die pad 8d with its surface 1a up (so that the upper surface 8da of the die pad 8d and the rear surface 1b of the semiconductor chip 1 are opposed to each other), and the semiconductor chip 2 is then mounted (stacked) on the semiconductor chip 1 with its surface 2a up (so that the surface 1a of the semiconductor chip 1 and the rear surface 2b of the semiconductor chip 2 are opposed to each other).

Also, in the semiconductor chip 1, as shown in FIG. 6, the plurality of electrode pads 1c are formed along the respective four sides of the surface 1a, and as shown in FIG. 7, a polyimide film 1g is formed around each of the electrode pads 1c on the surface 1a. In other words, the polyimide film 1g is formed on the surface 1a of the semiconductor chip 1 such that each of the plurality of electrode pads 1c is exposed.

On the other hand, as shown in FIGS. 8 and 9, the semiconductor chip 2 has a plurality of electrode pads 2c, a plurality of rearrangement pads 2k, a plurality of rearrangement wires 2j electrically connecting the electrode pads 2c with the rearrangement pads 2k, and the BCB films 2h and 2i covering the rearrangement wires 2j, respectively formed on its surface 2a.

Therefore, in the die bonding process in the present first embodiment, the semiconductor chip 1 whose surface 1a is covered with the polyimide film 1g is mounted on the first stage, and the semiconductor chip 2 whose surface 2a is covered with the BCB films 2h and 2i is mounted on the second stage. More specifically, since the QFP 6 is of the die-pad exposed type, the die bonding process is carried out so that the semiconductor chip 2 using the BCB films 2h and 2i whose adhesive strength to resin is low (that tend to cause a moisture absorption defect) is disposed at a position away from the die pad 8d that tends to be a moisture absorbing factor (position that is away from the die pad 8d as far as possible). In this manner, measures against moisture absorption defect are prepared at the time of completion of the die bonding process.

Thereafter, the wire bonding process is carried out. In the wire bonding process, as shown in FIGS. 19 to 21, the electrode pads 1c of the semiconductor chip 1 and the inner leads 8e, the electrode pads 1c of the semiconductor chip 1 and the bar leads 8f, as well as the electrode pads 2c of the semiconductor chip 2 and the electrode pads 1c of the semiconductor chip 1 are electrically connected to each other, respectively, through conductive members. Also, in the present embodiment, the conductive members are wires 5a and 5b.

In the wire bonding process, the wire bonding between the chips is first carried out, and the wire bonding between the chips and the leads is then carried out. At this time, in the wire bonding between the chips and the leads, the wire bonding is preferably carried out in an ascending order from the lowest height of the respective wire loops. For example, in the case of the structure shown in FIGS. 19 to 21, the electrode pads 2c of the semiconductor chip 2 and the electrode pads 1c of the semiconductor chip 1 are first connected to each other by the wires 5b. Thereafter, the electrode pads 1c of the semiconductor chip 1 and the bar leads 8f are connected by the wires 5a, and the electrode pads 1c of the semiconductor chip 1 and the inner leads 8e are lastly connected to each other. However, it is needless to say that, depending on the influences or the like from a capillary (not shown) on the operations at the time of the wire bonding process, the order of the wire bonding may be changed. Moreover, with respect to the wires 5a, a so-called positive bonding method in which after one portion of each wire 5a has been connected to the semiconductor chip 1 on the first stage, the other portion of the wire 5a is connected to the bar lead 8f or the inner lead 8e is adopted. On the other hand, with respect to the wires 5b as well, the so-called positive bonding method in which after one portion of each wire 5b has been connected to the semiconductor chip 2 on the second stage, the other portion of the wire 5b is connected to the semiconductor chip 1 on the first stage is adopted. As described above, in the present embodiment, the portion to which wires for power supply potential or reference potential are connected (bar leads 8f) is located at a position higher than the upper surface 8da of the die pad 8d (between the surface 1a and the rear surface 1b of the semiconductor chip 1). For this reason, in the case when the positive bonding method is adopted in the wire bonding process, the wires for power supply potential or reference potential can be easily connected even on the $2^{nd}$ bonding side as well (in this case, bar leads 8f).

Thereafter, a resin molding process is carried out. In the resin molding process, as shown in FIGS. 22 to 24, the sealing member 4 is formed for each of the device areas 8i by using, for example, epoxy-based thermosetting resin. At this time, since the QFP 6 is of a die-pad exposed type, the die pad 8d, the semiconductor chip 1, the semiconductor chip 2, the plurality of inner leads 8e, the plurality of suspension leads 8c, and the plurality of wires 5a and wires 5b are sealed such that the lower surface 8db of the die pad 8d is exposed. Thus, the plurality of outer leads 8b protrude from the respective side surfaces 4a of the sealing member 4.

Thereafter, a tie bar cutting process is carried out. In the tie bar cutting process, tie bars 8k that couple the adjacent outer leads 8b with each other are cut so that the mutually adjacent outer leads 8b are separated from each other.

Next, a process for removing burs is carried out. In the process for removing burs of the present first embodiment, the burs are removed by using, for example, a water jet system. By using the water jet system, it becomes possible to reduce damages to the package main body.

Moreover, even in the case when the water jet system is adopted, since measures against moisture absorption defect have been taken at the time of completion of the die bonding process in the QFP 6 of the present first embodiment, it is possible to avoid the problem of moisture absorption defect.

Thereafter, a plating process is carried out. In the plating process, an external plating process using a tin-bismuth based material or the like is carried out on the plurality of outer leads 8b that protrude from the sealing member 4 and the lower surface 8db of the die pad 8d.

Thereafter, a cutting and shaping process is carried out. In the cutting and shaping process, the plurality of outer leads 8b are cut and separated from the frame portion 8j of the lead frame 8, and then bent into a gull-wing shape. Thus, the individual pieces of QFP 6 are completed.

Thereafter, a marking process is carried out. In the marking process, a manufacturing history and the like thereof are marked on the surface of the sealing member 4 by using, for example, a laser beam or the like.

Thereafter, tests (sorting) are carried out. In the test (sorting) process, the assembled QFPs 6 are subjected to electrical characteristic tests so as to sort good products and defective products.

Thereafter, a baking process is carried out. In this baking process, for example, the QFP 6 is subjected to a heating treatment at, for example, 125° C. for about 16 hours. In this manner, since moisture contained in the QFP 6 can be removed, the margin against the moisture absorption defect can be increased. Moreover, it is also possible to provide measures against warping of the QFP 6. The measures against warping are particularly effective for a semiconductor device with a large package size.

Also, this baking process is preferably carried out within a predetermined period of time from the completion of the resin molding process, and should be carried out at least prior to the packaging at the time of shipment.

Then, an appearance scanning process is carried out. In this process, the appearance of the QFP 6 is inspected by a scanner, thereby completing the assembling process of the QFP 6.

Figure 45:
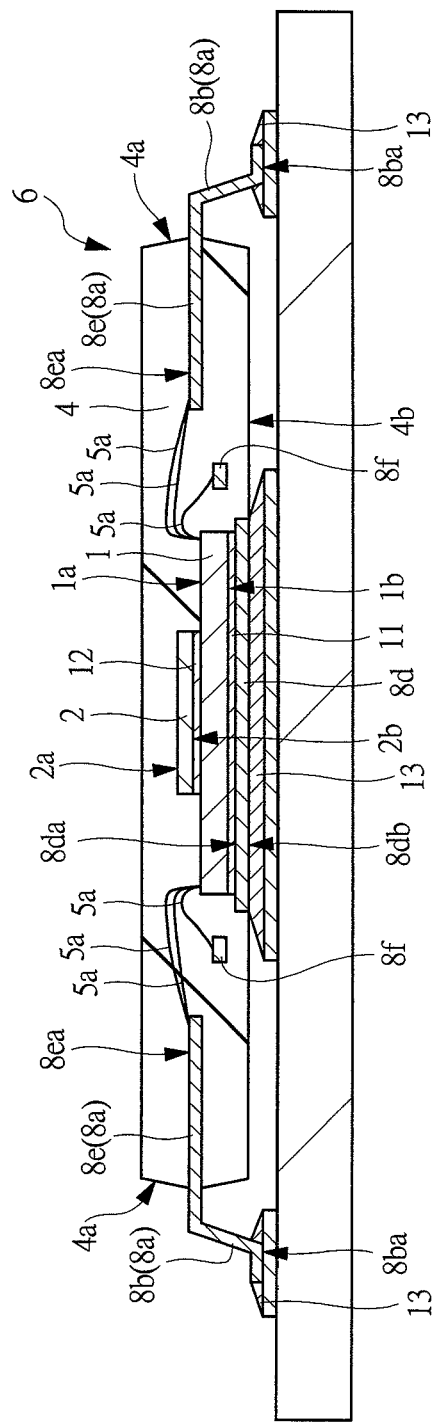
FIG. 45 is a cross-sectional view showing a state where the semiconductor device of the first embodiment of the present invention is mounted.

Thereafter, the finished QFP 6 is packaged so as to prevent moisture from entering the inside of the QFP 6 (moisture-proof packaging). Then, as shown in FIG. 45, the QFP 6 is mounted (reflow-mounted) on the mother board or the like with a solder material 13. At that time, in the QFP 6 of the present first embodiment, since the semiconductor chip 2 having the BCB films 2h and 2i is disposed at a position away from the die pad 8d and the margin against the moisture absorption defect is increased, it is possible to suppress the occurrence of the moisture absorption defect in the QFP 6.

Furthermore, since the measures against moisture absorption defect have been prepared at the time of completion of the die bonding process of the assembling process of the QFP 6, even when a moisture absorption defect occurs at an early stage of the assembling process, it is possible to suppress the occurrence of corrosion in the electrode pads 1c and 2c made of aluminum in the semiconductor chips 1 and 2.

According to the QFP 6 of the present first embodiment, in the semiconductor package (QFP 6) of a chip-stacked type having a structure in which the semiconductor chip 2 is stacked on the semiconductor chip 1 and the lower surface 8db of the die pad 8d is exposed from the lower surface 4b of the sealing member 4, since the semiconductor chip 2 in which the BCB films 2h and 2i made of a polymeric material containing at least benzocyclobutene 7 in its backbone as an organic monomer are formed is disposed at a position far from the die pad 8d, even when moisture invades therein through the interface between the die pad 8d and the sealing member 4, it takes time for the moisture to reach the semiconductor chip 2.

In other words, with respect to the semiconductor chips 1 and 2 stacked on the die pad 8d of the QFP 6 of the die-pad exposed type, since the semiconductor chip 2 having the BCB films 2h and 2i formed thereon is mounted on the second stage, the semiconductor chip 2 is placed at a position distant from the die pad 8d compared with the semiconductor chip 1. Therefore, even when moisture invades therein through the interface between the die pad 8d and the sealing member 4, it is possible to prolong the time required for the moisture to reach the semiconductor chip 2. More specifically, the margin against the moisture absorption defect in the QFP 6 can be increased.

As a result, since it is possible to make the moisture absorption defect less likely to occur, degradation in reliability of the QFP 6 can be suppressed.

Moreover, since a plurality of semiconductor chips (two chips in the present first embodiment) are stacked in this structure, it is possible to reduce the chip mounting area in comparison with a structure in which a plurality of semiconductor chips are placed flat, and thus the miniaturization of the QFP 6 can be achieved.

Furthermore, since the lower surface 8db of the die pad 8d is exposed from the lower surface 4b of the sealing member 4, the die pad 8d can be used as one of external terminals serving as a common terminal for GND, a power supply, and the like, and thus the number of terminals of the QFP 6 can be increased and the increase in the number of pins of the QFP 6 can be achieved.

Furthermore, since the bar leads 8f that are connected to the die pad 8d are provided, the down bonding can be carried out on the bar leads 8f, and thus the number of terminals to be commonly used can be increased, and the further increase in the number of pins of the QFP 6 can be achieved.

Since the number of terminals of the QFP 6 can be increased, the outside size of the QFP 6 can be reduced when the number of terminals is supposed to be fixed. In other words, it is possible to achieve the miniaturization of the QFP 6.

Moreover, since a plurality of or a plurality of types of semiconductor chips are mounted in the chip-stacked structure, it is possible to achieve a highly functional structure (highly integrated structure) of the QFP 6.

Second Embodiment

Figure 25:
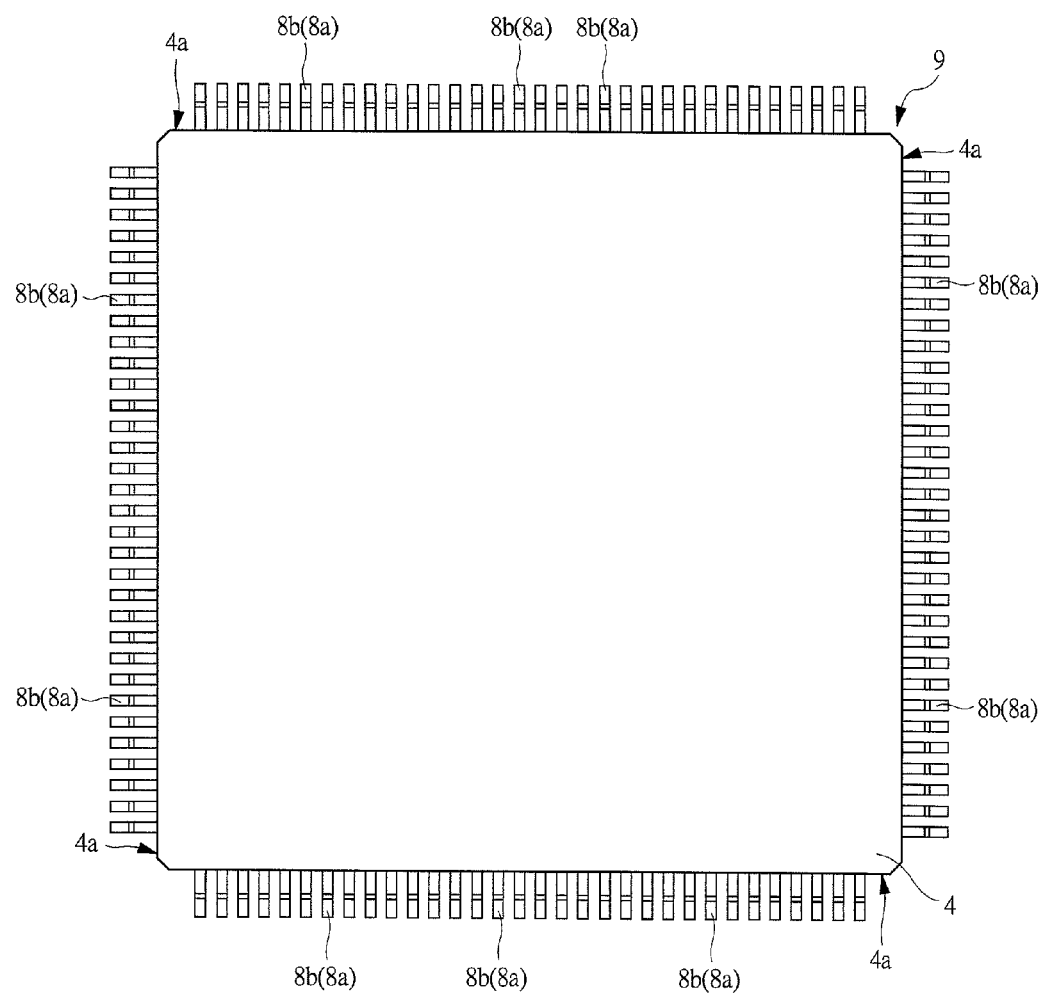
FIG. 25 is a plan view showing one example of a structure of a semiconductor device of the second embodiment of the present invention.
Figure 26:
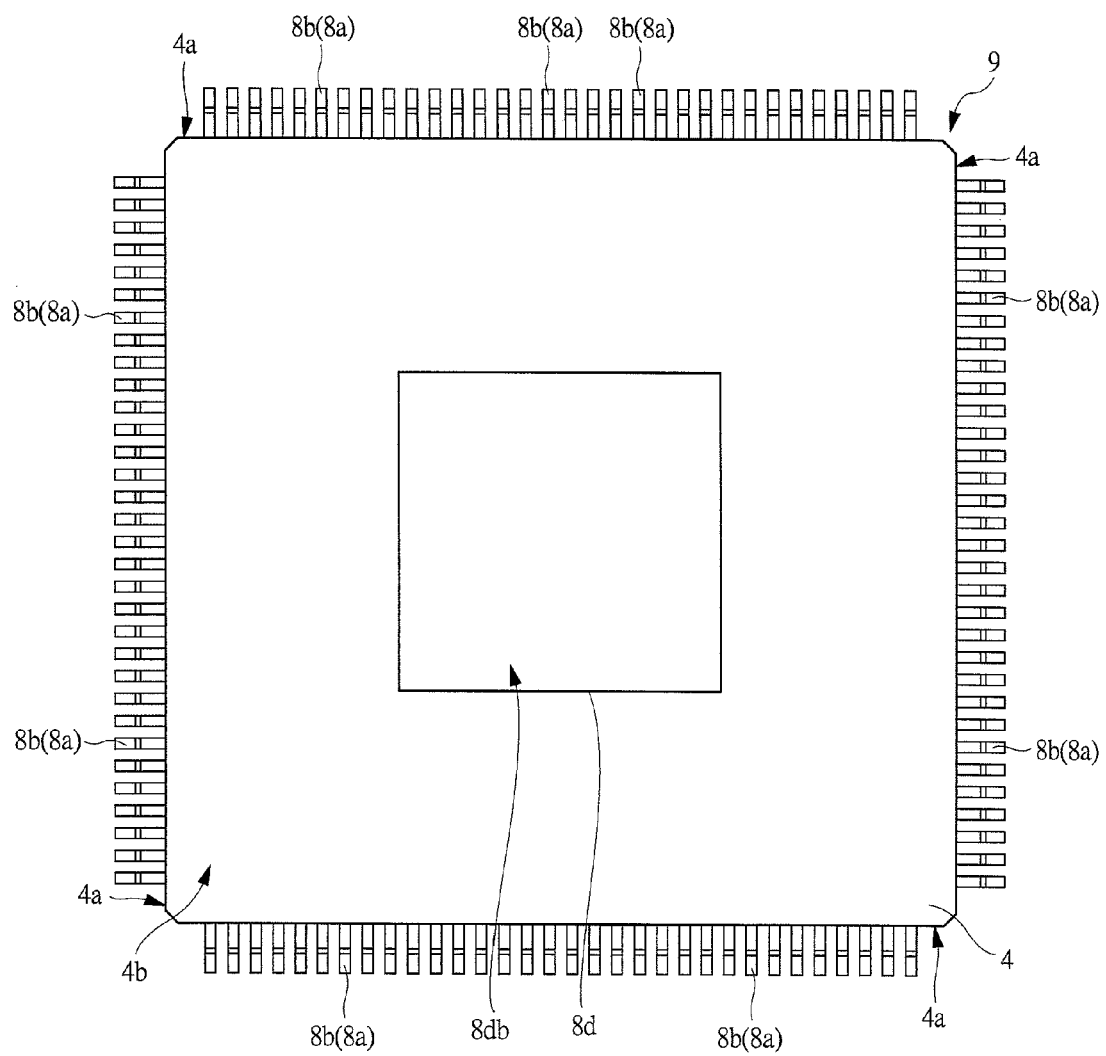
FIG. 26 is a rear-surface view showing one example of the structure of the semiconductor device of FIG. 25.
Figure 27:
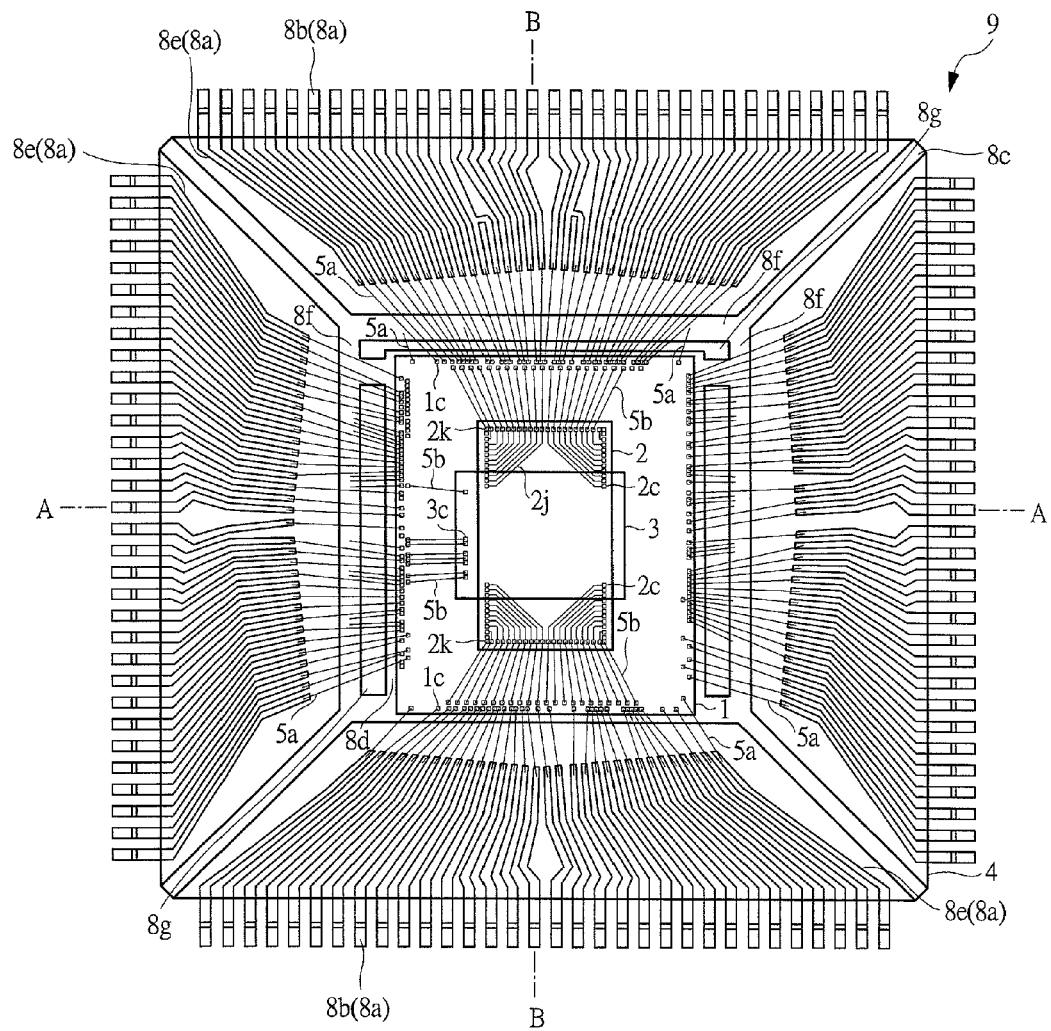
FIG. 27 is a plan view showing the structure of the semiconductor device of FIG. 25 in a transparent manner through a sealing member.
Figure 28:
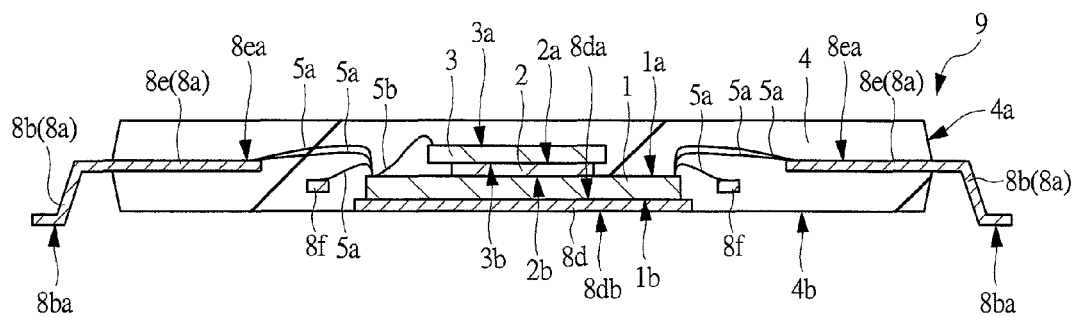
FIG. 28 is a cross-sectional view showing one example of a structure taken along the A-A line of FIG. 27.
Figure 29:
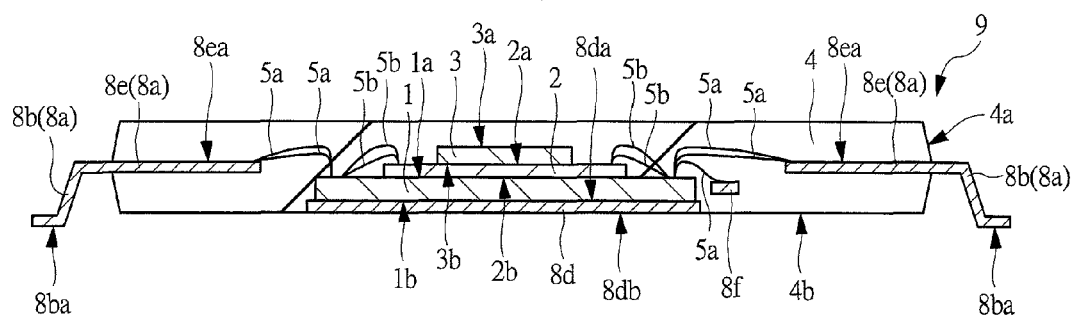
FIG. 29 is a cross-sectional view showing one example of a structure taken along the line B-B of FIG. 27.
Figure 30:
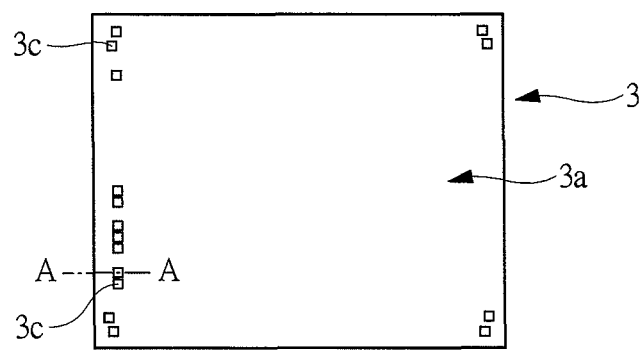
FIG. 30 is a plan view showing one example of a structure of a semiconductor chip on a third stage mounted in the semiconductor device of FIG. 25.
Figure 31:
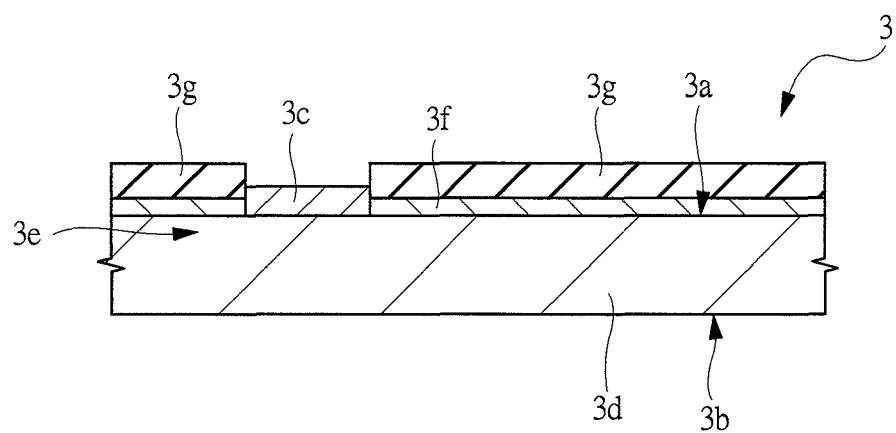
FIG. 31 is a partial cross-sectional view showing one example of a structure taken along the line A-A of FIG. 30.

FIG. 25 is a plan view showing one example of a structure of a semiconductor device of the second embodiment of the present invention, FIG. 26 is a rear-surface view showing one example of the structure of the semiconductor device of FIG. 25, FIG. 27 is a plan view showing the structure of the semiconductor device of FIG. 25 in a transparent manner through a sealing member, FIG. 28 is a cross-sectional view showing one example of a structure taken along the A-A line of FIG. 27, and FIG. 29 is a cross-sectional view showing one example of a structure taken along the line B-B of FIG. 27. Furthermore, FIG. 30 is a plan view showing one example of a structure of a semiconductor chip on a third stage mounted in the semiconductor device of FIG. 25, and FIG. 31 is a partial cross-sectional view showing one example of a structure taken along the line A-A of FIG. 30.

Like the QFP 6 in the first embodiment, a semiconductor device of the present second embodiment is a chip-stacked and die-pad exposed type semiconductor device. The point different from the QFP 6 of the first embodiment lies in that three semiconductor chips are mounted (stacked) therein, and a QFP 9 is exemplified as one example of the semiconductor device also in the description of the present second embodiment.

The QFP 9 of the present second embodiment shown in FIGS. 25 to 29 has a structure in which a semiconductor chip 3 is stacked on the semiconductor chip 2 on the second stage of the QFP 6 of the first embodiment, and the other structures such as that the lower surface 8db of the die pad 8d is exposed from the lower surface 4b of the sealing member 4 and the like are the same as those of the QFP 6 of the first embodiment.

In the QFP 9, as shown in FIG. 28 and FIG. 29, the semiconductor chip 1 (controller chip) on a first stage is mounted on the die pad 8d, the semiconductor chip 2 (SDRAM) is stacked on the semiconductor chip 1, and the semiconductor chip 3 is stacked on the semiconductor chip 2. The semiconductor chip 3 is, for example, a flash memory (nonvolatile memory).

As shown in FIG. 30 and FIG. 31, the semiconductor chip 3 has a surface 3a and a rear surface 3b opposite to the surface 3a, and a semiconductor element (circuit element) 3c (not shown) is formed on the surface 3a together with a plurality of electrode pads (bonding pads) 3c. The plurality of electrode pads 3c are electrically connected to the semiconductor element 3e mentioned above.

Moreover, as shown in FIG. 31, the semiconductor chip 3 has a silicon substrate 3d, a silicon nitride (SiN) film 3f formed on the surface 3a, and a polyimide film (protective film, insulating film) 3g formed on the silicon nitride film 3f such that the plurality of electrode pads 3c for bonding are exposed.

Also, in the QFP 9 of the present second embodiment, since the semiconductor chip (flash memory) 3 on the third stage is stacked on the semiconductor chip (SDRAM) 2 on the second stage, as shown in FIG. 27, some of the plurality of electrode pads 2c of the semiconductor chip 2 on the second stage are formed at positions overlapped with the semiconductor chip 3 when seen in a plan view. More specifically, some of the electrode pads 2c of the plurality of electrode pads 2c of the semiconductor chip 2 on the second stage are arranged so as to be concealed below the semiconductor chip 3 on the third stage, and these electrode pads 2c are not exposed when seen in a plan view.

Therefore, since they are arranged in the concealed state below the semiconductor chip 3 on the third stage, it is not possible to carry out wire bonding to these electrode pads 2c.

Accordingly, as shown in FIG. 8 and FIG. 9, the rearrangement wires 2j are formed on the surface 2a of the semiconductor chip 2 (SDRAM) like the structure of the first embodiment. More specifically, the plurality of electrode pads 2c are rearranged by the rearrangement wires 2j at positions where the wire bonding can be carried out. In the structure shown in FIG. 27, the plurality of electrode pads 2c are respectively led out by the rearrangement wires 2j, the plurality of rearrangement pads 2k are formed along two opposed sides exposed on the surface 2a of FIG. 8 when seen in a plan view, and the plurality of electrode pads 2c and the plurality of rearrangement pads 2k are electrically connected with each other by the rearrangement wires 2j. More specifically, in the semiconductor chip 2, the rearrangement pads 2k of the rearrangement wires (wiring layer) 2j are formed at positions that are not overlapped with the semiconductor chip 3 on the third stage when seen in a plan view.

Moreover, as described in the first embodiment, since the rearrangement wires 2j having a long length and made of gold are formed side by side at narrow intervals with a high density on the surface 2a of the semiconductor chip 2, BCE films 2h and 2i having a low dielectric constant are formed as insulating films covering the rearrangement wires 2j.

Since the QFP 9 of the present second embodiment is also of the die-pad exposed type, measures against the moisture absorption from the die pad 8d needs to be taken like the QFP 6 of the first embodiment, and in the QFP 9 of the present second embodiment as well, the semiconductor chip 2 having the BCB films 2h and 2i is disposed at a position away from the die pad 8d.

In other words, the semiconductor chip 2 having the BCB films 2h and 2i is disposed on the second stage (from the die pad side) so as to be far away from the die pad 8d.

Also, the QFP 9 has a structure in which the three semiconductor chips are stacked, and one portion of the sealing member 4 is disposed on the semiconductor chip 3 on the third stage, and since the three-chip-layered structure is formed, the surface of the chip on the third stage tends to be located at a position comparatively close to the surface of the sealing member. Therefore, when keeping the distance from the die pad 8d and the moisture absorption from the surface of the sealing member are both taken into consideration, the semiconductor chip (SDRAM) 2 having the BCB films 2h and 2i is preferably disposed at a position of the middle stage (second stage) in the case of the three-chip-layered structure.

As a result, since the semiconductor chip 2 is positioned away from the die pad 8d and is also away from the surface of the sealing member, even when moisture invades therein through the interface between the die pad 8d and the sealing member 4 and from the surface of the sealing member, it is possible to prolong a period of time for the moisture to reach the semiconductor chip 2. In other words, it is possible to increase the margin against the moisture absorption defect in the QFP 9 having the three-chip-layered structure.

In this manner, since it is possible to make the moisture absorption defect less likely to occur, degradation in reliability of the QFP 9 can be suppressed.

Since the other structures of the QFP 9 of the present second embodiment are the same as those of the QFP 6 of the first embodiment, the redundant descriptions thereof will be omitted.

Next, the assembling process of the QFP 9 will be described.

Since the QFP 9 has the three-chip-layered structure, the assembling process thereof is different from that of the QFP 6 of the first embodiment in that a die bonding process of the semiconductor chip 3 on the third stage and a wire bonding process to this semiconductor chip 3 are added.

Like the QFP 6 of the first embodiment, in the assembling process of the QFP 9, a thin-plate shaped lead frame 8 in which a plurality of device areas 8i are continuously formed as shown in FIG. 11 is prepared. Each of the device areas 8i is an area in which one QFP 9 is formed, and in the present second embodiment, the assembling process of the QFP 9 is described with reference to the drawings showing one device area 8i for the sake of convenience.

As shown in FIG. 12, the thin-plate shaped lead frame 8 is prepared, in which one die pad (chip mounting part) 8d, a plurality of suspension leads 8c supporting this die pad 8d, a plurality of inner leads 8e that are arranged around the die pad 8d and also located between the adjacent suspension leads 8c among the plurality of suspension leads 8c, and a plurality of outer leads 8b formed integrally with the inner leads 8e are formed in each of the device areas 8i.

Moreover, on the periphery of the die pad 8d, bar leads 8f connected to the die pad 8d by connecting parts 8h are formed with openings 8g interposed therebetween. The bar leads 8f are integrally connected also to the suspension leads 8c.

Also, as shown in FIG. 11 and FIG. 12, each of the device areas 8i is surrounded by a frame portion 8j, and the plurality of outer leads 8b and the plurality of suspension leads 8c are supported by the frame portion 8j.

Moreover, the lead frame 8 is made of, for example, metal such as copper (Cu).

Figure 32:
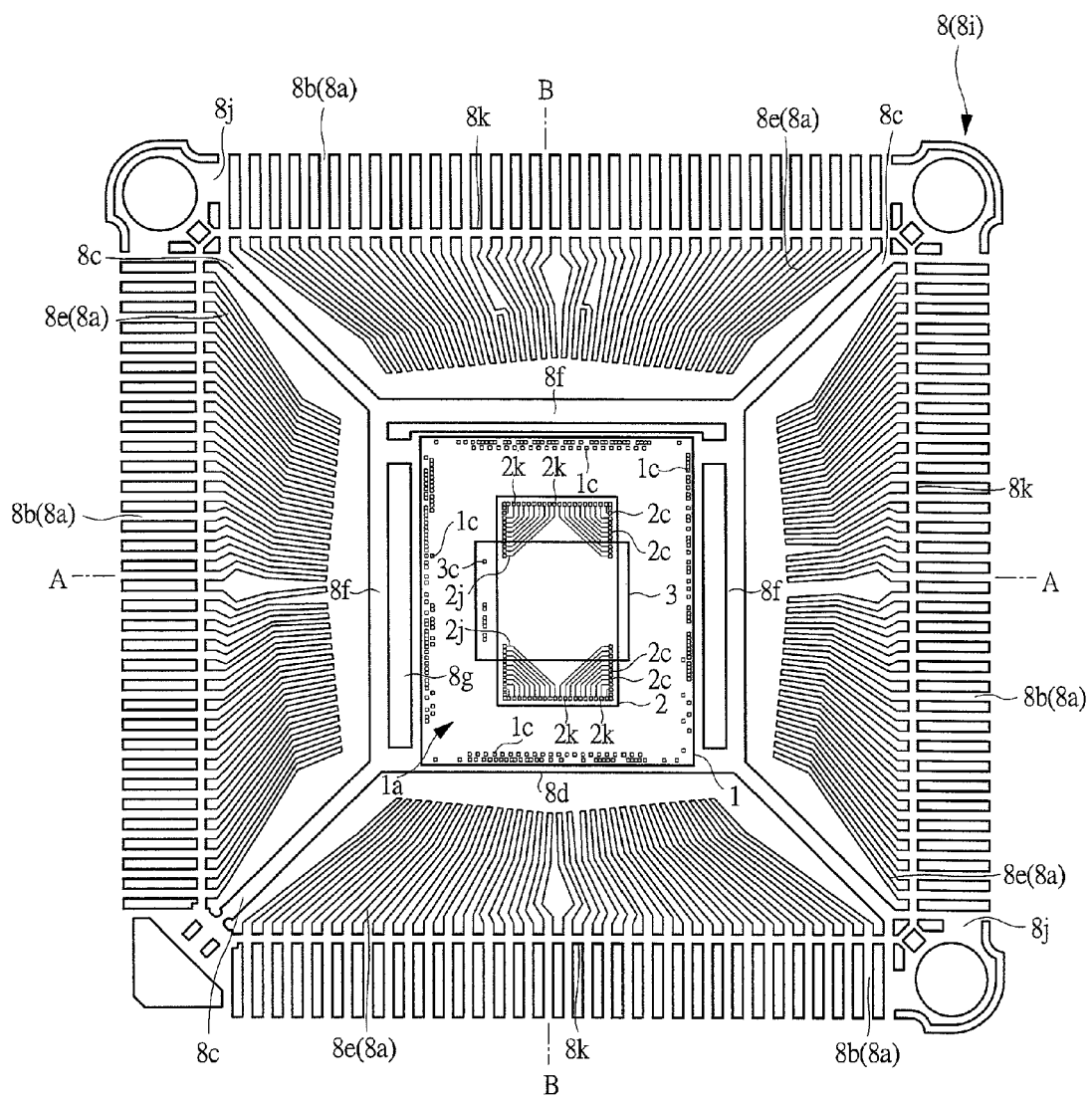
FIG. 32 is a partial plan view showing one example of a structure after die bonding of the third-stage chip in the assembling process of the semiconductor device of FIG. 25.
Figure 33:
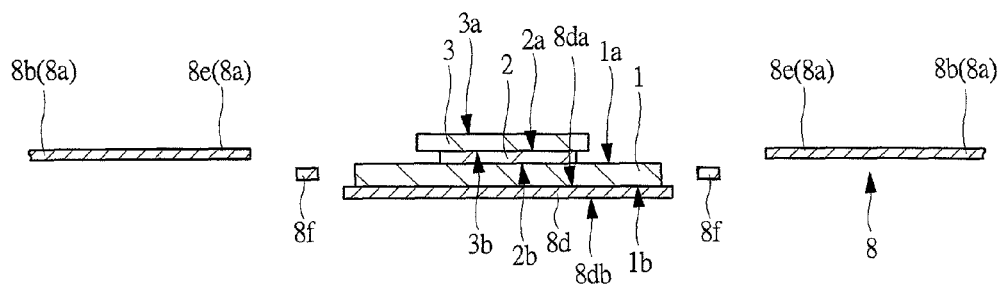
FIG. 33 is a cross-sectional view showing one example of a structure taken along the A-A line of FIG. 32.
Figure 34:
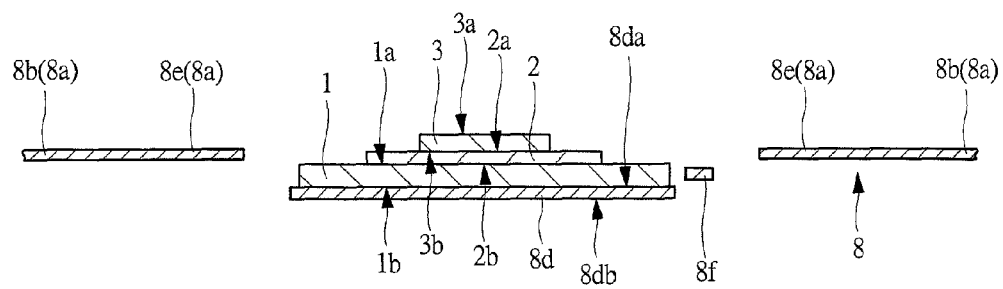
FIG. 34 is a cross-sectional view showing one example of a structure taken along the line B-B of FIG. 32.

Thereafter, a die bonding process is carried out. In the die bonding process, first, as shown in FIGS. 13 to 15, a controller chip serving as the semiconductor chip 1 on the first stage is mounted on the die pad 8d, and as shown in FIGS. 16 to 18, an SDRAM serving as the semiconductor chip 2 on the second stage is then mounted (stacked) on the semiconductor chip 1, and as shown in FIGS. 32 to 34, a flash memory serving as the semiconductor chip 3 on the third stage is further mounted (stacked) on the semiconductor chip 2.

At this time, the semiconductor chip 1, the semiconductor chip 2, and the semiconductor chip 3 are all mounted with their faces up so that surfaces 1a, 2a, and 3a thereof face upward. In other words, the semiconductor chip 1 is first mounted on the upper surface 8da of the die pad 8d with its surface 1a up (so that the upper surface 8da of the die pad 8d and the rear surface 1b of the semiconductor chip 1 are opposed to each other), and the semiconductor chip 2 is then mounted (stacked) on the semiconductor chip 1 with its surface 2a up (so that the surface 1a of the semiconductor chip 1 and the rear surface 2b of the semiconductor chip 2 are opposed to each other). Furthermore, the semiconductor chip 3 is mounted (stacked) on the semiconductor chip 2 with its surface 3a up (so that the surface 2a of the semiconductor chip 2 and the rear surface 3b of the semiconductor chip 3 are opposed to each other).

Also, in the semiconductor chip 1, as shown in FIG. 6, the plurality of electrode pads 1c are formed along the respective four sides of the surface 1a, and as shown in FIG. 7, a polyimide film 1g is formed around each of the electrode pads 1c on the surface 1a. In other words, the polyimide film 1g is formed on the surface 1a of the semiconductor chip 1 such that each of the plurality of electrode pads 1c is exposed.

On the other hand, as shown in FIGS. 8 and 9, the semiconductor chip 2 has a plurality of electrode pads 2c, a plurality of rearrangement pads 2k, a plurality of rearrangement wires 2j electrically connecting the electrode pads 2c with the rearrangement pads 2k, and the BCB films 2h and 2i covering the rearrangement wires 2j, respectively formed on its surface 2a.

Moreover, the semiconductor chip 3 has the same cross-sectional structure as that of the semiconductor chip 1, and a polyimide film 3g is formed around each of the electrode pads 3c on the surface 3a as shown in FIG. 31. In other words, the polyimide film 3g is formed on the surface 3a of the semiconductor chip 3 such that each of the plurality of electrode pads 3c is exposed.

Therefore, in the die bonding process of the present second embodiment, the semiconductor chip 1 whose surface 1a is covered with the polyimide film 1g is mounted on the first stage, the semiconductor chip 2 whose surface 2a is covered with the BCB films 2h and 2i is mounted on the second stage, and the semiconductor chip 3 whose surface 3a is covered with the polyimide film 3g is mounted on the third stage.

More specifically, since the QFP 9 is also of the die-pad exposed type, the semiconductor chip 2 using the BCB films 2h and 2i having low adhesive strength to resin (tend to cause moisture absorption defect) is disposed at the position away from the die pad 8d and on the middle second stage also away from the surface of the sealing member. In this manner, also in the assembling process of the QFP 9, measures against moisture absorption defect are prepared at the time of completion of the die bonding process like the QFP 6 of the first embodiment.

Figure 35:
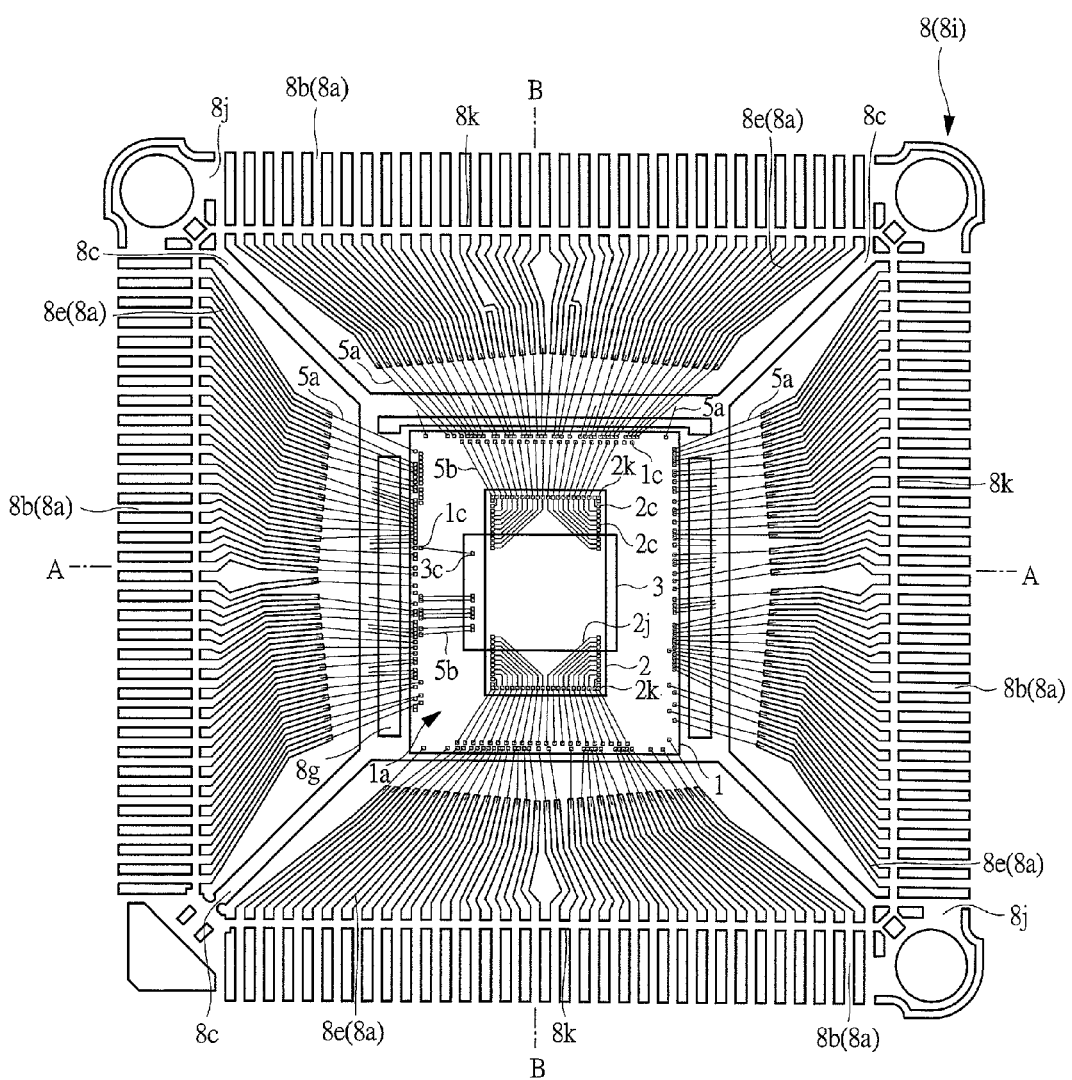
FIG. 35 is a partial plan view showing one example of a structure after wire bonding in the assembling process of the semiconductor device of FIG. 25.
Figure 36:
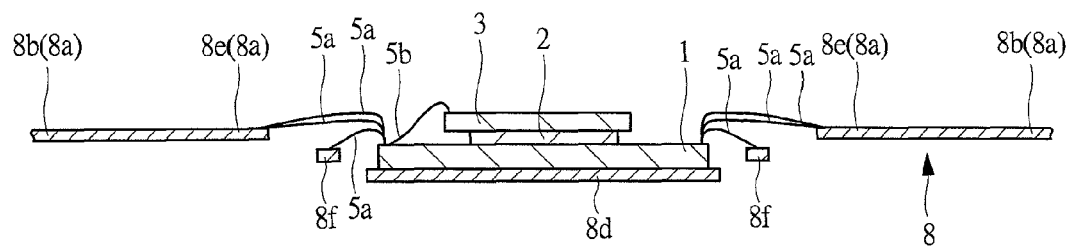
FIG. 36 is a cross-sectional view showing one example of a structure taken along the A-A line of FIG. 35.
Figure 37:
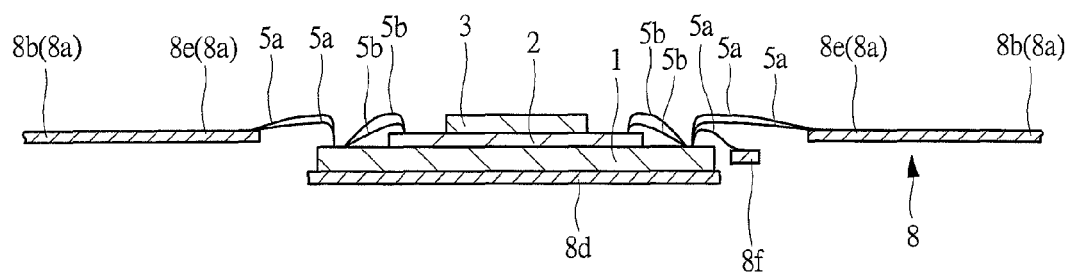
FIG. 37 is a cross-sectional view showing one example of a structure taken along the line B-B of FIG. 35.

Thereafter, wire bonding process is carried out. In the wire bonding process, as shown in FIGS. 19 to 21, the electrode pads is of the semiconductor chip 1 and the inner leads 8e, the electrode pads 1c of the semiconductor chip 1 and the bar leads 8f, the electrode pads 2c of the semiconductor chip 2 and the electrode pads 1c of the semiconductor chip 1, and the electrode pads 3c of the semiconductor chip 3 and the electrode pads 1c of the semiconductor chip 1 as shown in FIGS. 35 to 37 are electrically connected to each other, respectively, by wire bonding.

In the wire bonding process, the wire bonding between the chips is first carried out, and the wire bonding between the chips and the leads is then carried out. At this time, in the wire bonding between the chips and the leads, the wire bonding is preferably carried out in an ascending order from the lowest height of the respective wire loops. For example, in the case of the wire bonding of the QFP 9, the electrode pads 3c of the semiconductor chip 3 and the electrode pads 1c of the semiconductor chip 1 are connected to each other by wires 5b, and the electrode pads 2c of the semiconductor chip 2 and the electrode pads 1c of the semiconductor chip 1 are then connected to each other by the wires 5b. Thereafter, the electrode pads 1c of the semiconductor chip 1 and the bar leads 8f are connected by wires 5a, and the electrode pads is of the semiconductor chip 1 and the inner leads 8e are lastly connected to each other. However, it is needless to say that, depending on the influences or the like from a capillary (not shown) on the operations at the time of the wire bonding process, the order of the wire bonding may be changed.

Thereafter, a resin molding process is carried out. In the resin molding process, for example, a sealing member 4 is formed for each of the device areas 8i as shown in FIG. 28 and FIG. 29 by using epoxy-based thermosetting resin. At this time, since the QFP 9 is also of a die-pad exposed type, the die pad 8d, the semiconductor chip 1, the semiconductor chip 2, the semiconductor chip 3, the plurality of inner leads 8e, the plurality of suspension leads 8c, and the plurality of wires 5a and wires 5b are sealed such that the lower surface 8db of the die pad 8d is exposed. Thus, the plurality of outer leads 8b protrude from the respective side surfaces 4a of the sealing member 4.

Thereafter, a tie bar cutting process is carried out. In the tie bar cutting process, tie bars 8k shown in FIG. 35 which couple the adjacent outer leads 8b to each other are cut so that the mutually adjacent outer leads 8b are separated from each other.

Next, a process for removing burs is carried out. In the process for removing burs of the present second embodiment, the burs are removed by using, for example, a water jet system. By using the water jet system, it becomes possible to reduce damages to the package main body.

Moreover, even in the case when the water jet system is adopted, since measures against moisture absorption defect have been taken at the time of completion of the die bonding process in the QFP 9 of the present second embodiment, it is possible to avoid the problem of moisture absorption defect.

Thereafter, a plating process is carried out. In the plating process, an external plating process using a tin-bismuth based material or the like is carried out on the plurality of outer leads 8b that protrude from the sealing member 4 and the lower surface 8db of the die pad 8d.

Thereafter, a cutting and shaping process is carried out. In the cutting and shaping process, the plurality of outer leads 8b are cut and separated from the frame portion 8j of the lead frame 8, and then bent into a gull-wing shape. Thus, the individual pieces of QFP 9 are completed.

Thereafter, a marking process is carried out. In the marking process, a manufacturing history and the like thereof are marked on the surface of the sealing member 4 by using, for example, a laser beam or the like.

Thereafter, tests (sorting) are carried out. In the test (sorting) process, the assembled QFPs 9 are subjected to electrical characteristic tests so as to sort good products and defective products.

Thereafter, a baking process is carried out. In this baking process, for example, the QFP 9 is subjected to a heating treatment at, for example, 125° C. for about 16 hours. In this manner, since moisture contained in the QFP 9 can be removed, the margin against the moisture absorption defect can be increased. Moreover, it is also possible to provide measures against warping of the QFP 9. The measures against warping are particularly effective for a semiconductor device with a large package size.

Also, this baking process is preferably carried out within a predetermined period of time from the completion of the resin molding process, and should be carried out at least prior to the packaging at the time of shipment.

Then, an appearance scanning process is carried out. In this process, the appearance of the QFP 9 is inspected by a scanner, thereby completing the assembling process of the QFP 9.

Thereafter, the finished QFP 9 is packaged so as to prevent moisture from entering the inside of the QFP 9 (moisture-proof packaging). Then, the QFP 9 is mounted (reflow-mounted) on the mother board or the like with a solder material 13 (see FIG. 45). At that time, in the QFP 9 of the present second embodiment, since the semiconductor chip 2 having the BCB films 2h and 2i is disposed at a position away from the die pad 8d and the surface of the sealing member, and the margin against the moisture absorption defect of the QFP 9 is increased, it is possible to suppress the occurrence of the moisture absorption defect in the QFP 9.

Furthermore, since the measures against moisture absorption defect have been prepared at the time of completion of the die bonding process of the assembling process of the QFP 9, even when a moisture absorption defect occurs at an early stage of the assembling process, it is possible to suppress the occurrence of corrosion in the electrode pads 1c, 2c and 3c made of aluminum in the semiconductor chips 1, 2 and 3.

In the QFP 9 of the present second embodiment also, since the semiconductor chip 2 having the BCE films 2h and 2i formed thereon is disposed at the position of the second stage that is away from the die pad 8d and the surface of the sealing member, even when moisture invades therein through the interface between the die pad 8d and the sealing member 4 or from the surface of the sealing member, it is possible to prolong the time required for the moisture to reach the semiconductor chip 2.

In other words, with respect to the semiconductor chips 1, 2 and 3 stacked on the die pad 8d of the QFP 9 of the die-pad exposed type, since the semiconductor chip 2 having the BCB films 2h and 2i formed thereon is mounted on the second stage, the semiconductor chip 2 is placed at a position distant from the die pad 8d and the surface of the sealing member compared with the semiconductor chip 1 and the semiconductor chip 3. Therefore, even when moisture invades therein through the interface between the die pad 8d and the sealing member 4 or from the surface of the sealing member, it is possible to prolong the time required for the moisture to reach the semiconductor chip 2. More specifically, the margin against the moisture absorption defect in the QFP 9 can be increased.

As a result, since it is possible to make the moisture absorption defect less likely to occur, degradation in reliability of the QFP 9 can be suppressed.

Since the other effects obtained by the QFP 9 of the present second embodiment are the same as those of the QFP 6 of the first embodiment, the redundant descriptions thereof will be omitted.

In the foregoing, the invention made by the inventor of the present invention has been concretely described based on the embodiments. However, it is needless to say that the present invention is not limited to the foregoing embodiments and various modifications and alterations can be made within the scope of the present invention.

MODIFIED EXAMPLE 1

Figure 38:
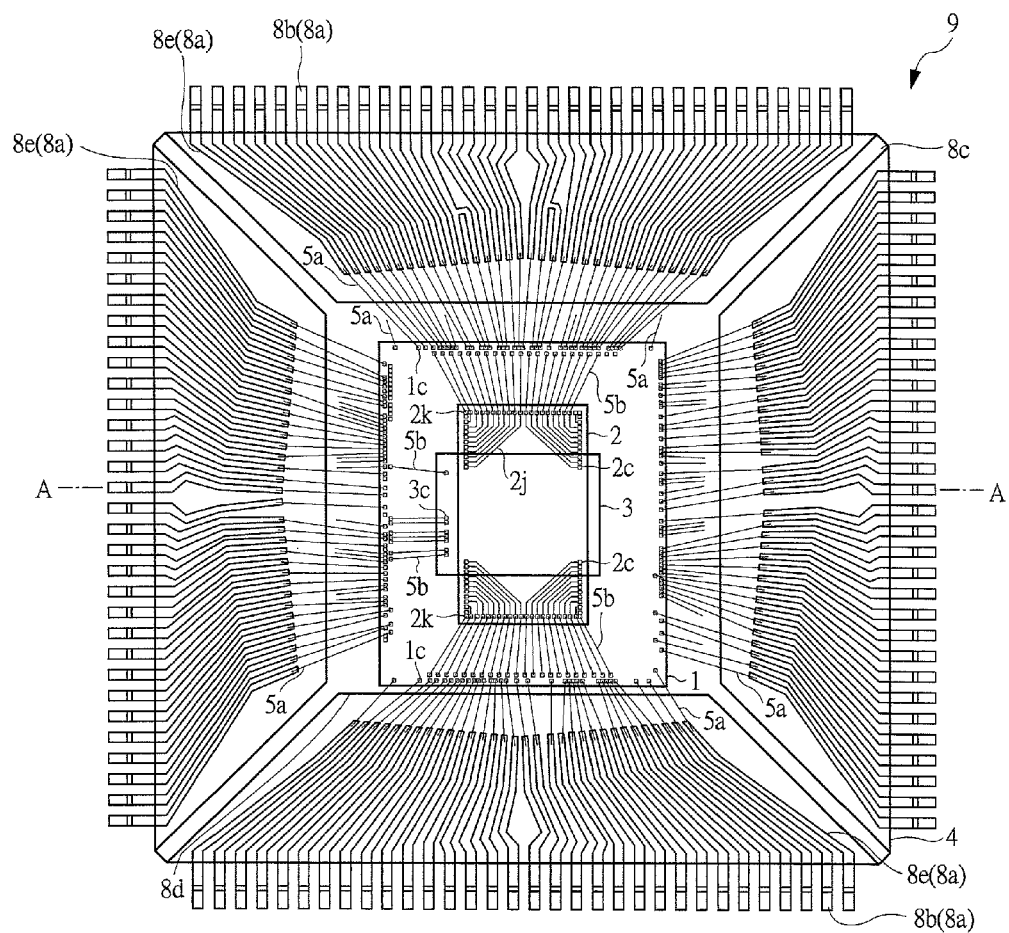
FIG. 38 is a plan view showing a structure of a semiconductor device of a modified example 1 of the present invention in a transparent manner through a sealing member.
Figure 39:
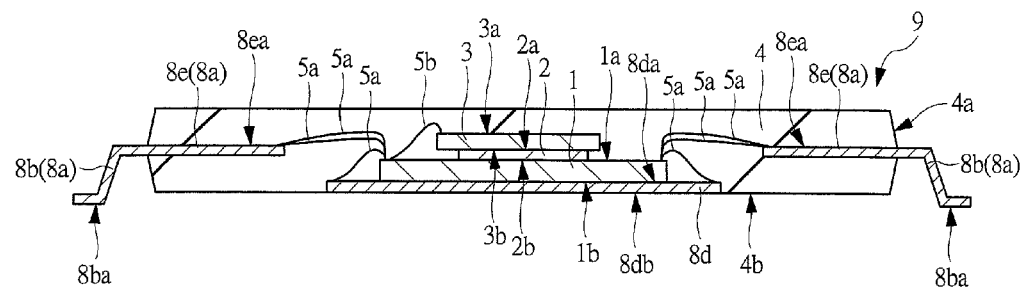
FIG. 39 is a cross-sectional view showing a structure taken along the A-A line of FIG. 38.

For example, in the aforementioned first and second embodiments, a QFP structure in which a plurality of bar leads 8f are formed on the periphery of the die pad 8d has been described. However, as shown in FIGS. 38 and 39, the bar leads 8f may not necessarily be formed. In this case, a die pad 8d whose outside size is larger than the outside size of the die pad 8d described in the aforementioned first and second embodiments is used. Moreover, wires 5a are connected to a peripheral edge portion on the upper surface 8da of the die pad 8d that is exposed from the semiconductor chip 1 on the first stage. In this manner, in comparison with the aforementioned first and second embodiments, the heat dissipation effect of the QFP 9 can be enhanced. Furthermore, when carrying out a solder connection of the die pad 8d, the mounting strength of the QFP 9 mounted on the mounting substrate can be enhanced in comparison with the aforementioned first and second embodiments.

MODIFIED EXAMPLE 2

Figure 40:
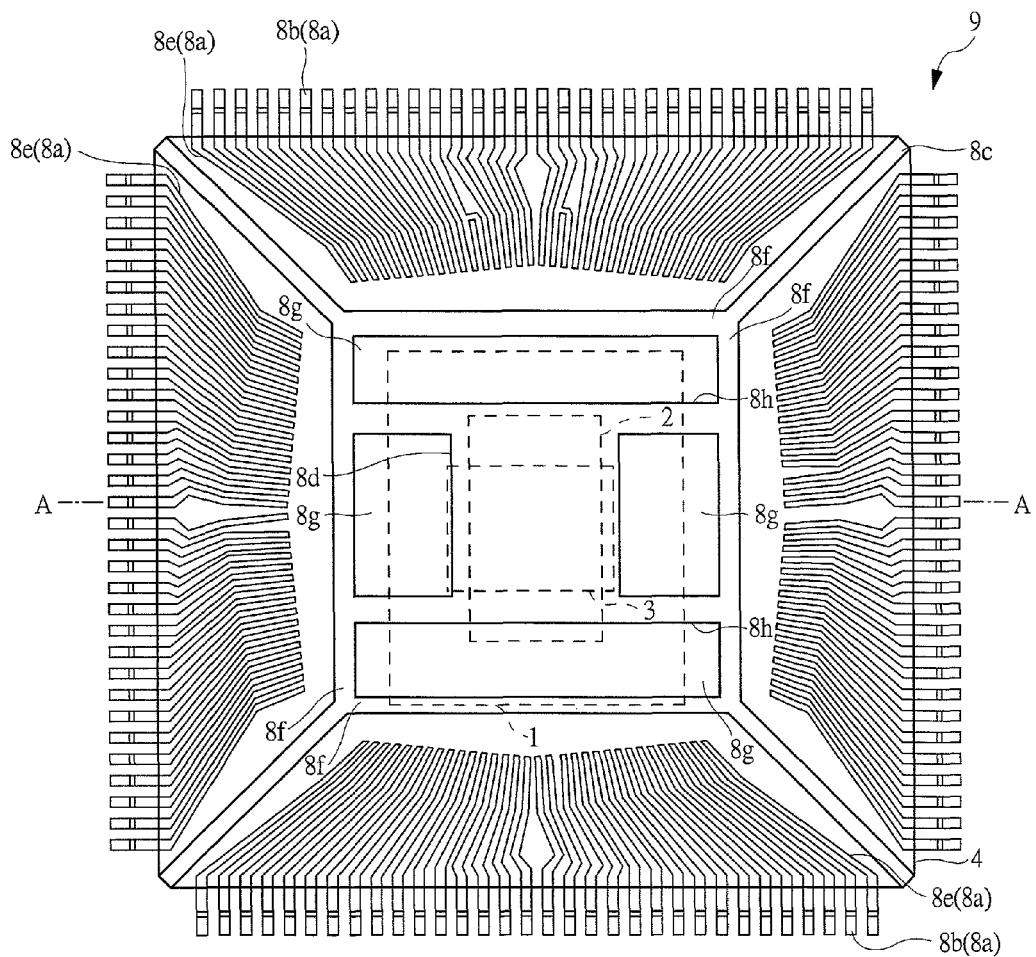
FIG. 40 is a plan view showing a structure of a semiconductor device of a modified example 2 of the present invention in a transparent manner through a sealing member.
Figure 41:
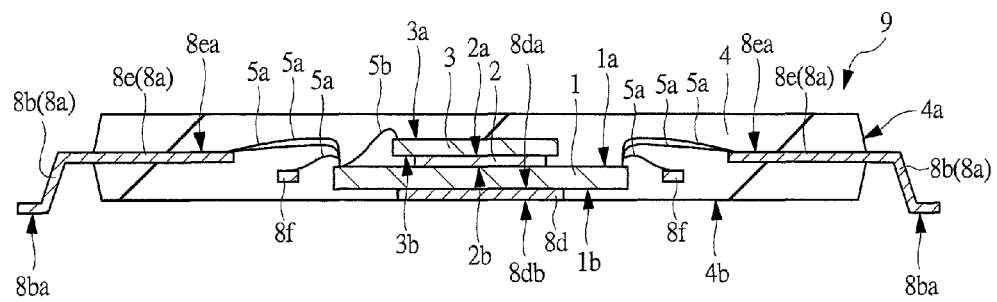
FIG. 41 is a cross-sectional view showing a structure taken along the A-A line of FIG. 40.

Moreover, as shown in FIG. 40 and FIG. 41, for example, a die pad having an outside size smaller than the outside size of the semiconductor chip on the first stage, more specifically, the die pad 8d whose upper surface 8da is smaller than the rear surface 1b of the semiconductor chip 1, that is, a so-called small tab may be adopted. Also, in FIG. 40, for the sake of convenience, the electrode pads of the respective chips and the plurality of wires are omitted from the drawing so as to make the drawing easily understood.

In the QFP 9 of FIG. 40, bar leads 8f are formed on the periphery of the die pad 8d having an area smaller than the rear surface 1b of the semiconductor chip 1 with openings 8g interposed therebetween, and the die pad 8d and the bar leads 8f are connected by the connecting parts 8h. Moreover, in the QFP 9 of the modified example 2 of FIG. 41, the down bonding is carried out for each of the bar leads 8f like in the QFP 9 of the second embodiment.

Since the QFP 9 is designed to have the small tab structure as shown in the modified example 2 of FIG. 41, even when peeling occurs between the side surface of the die pad 8d and the sealing member 4, it is possible to suppress this peeling from reaching (advancing to) the surface 1a of the semiconductor chip 1. In other words, since the semiconductor chip 1 is made of silicon (Si) and the adhesive strength between the semiconductor chip 1 and the resin forming the sealing member 4 (for example, epoxy-based thermosetting resin) is higher than the adhesive strength between the lead frame 8 (die pad 8*d*) made of metal (for example, copper (Cu)) and the resin forming the sealing member 4, the small tab structure in which the adhesion area between the semiconductor chip 1 and the resin is larger is considered to have a greater margin against the moisture absorption defect.

MODIFIED EXAMPLE 3

Figure 42:
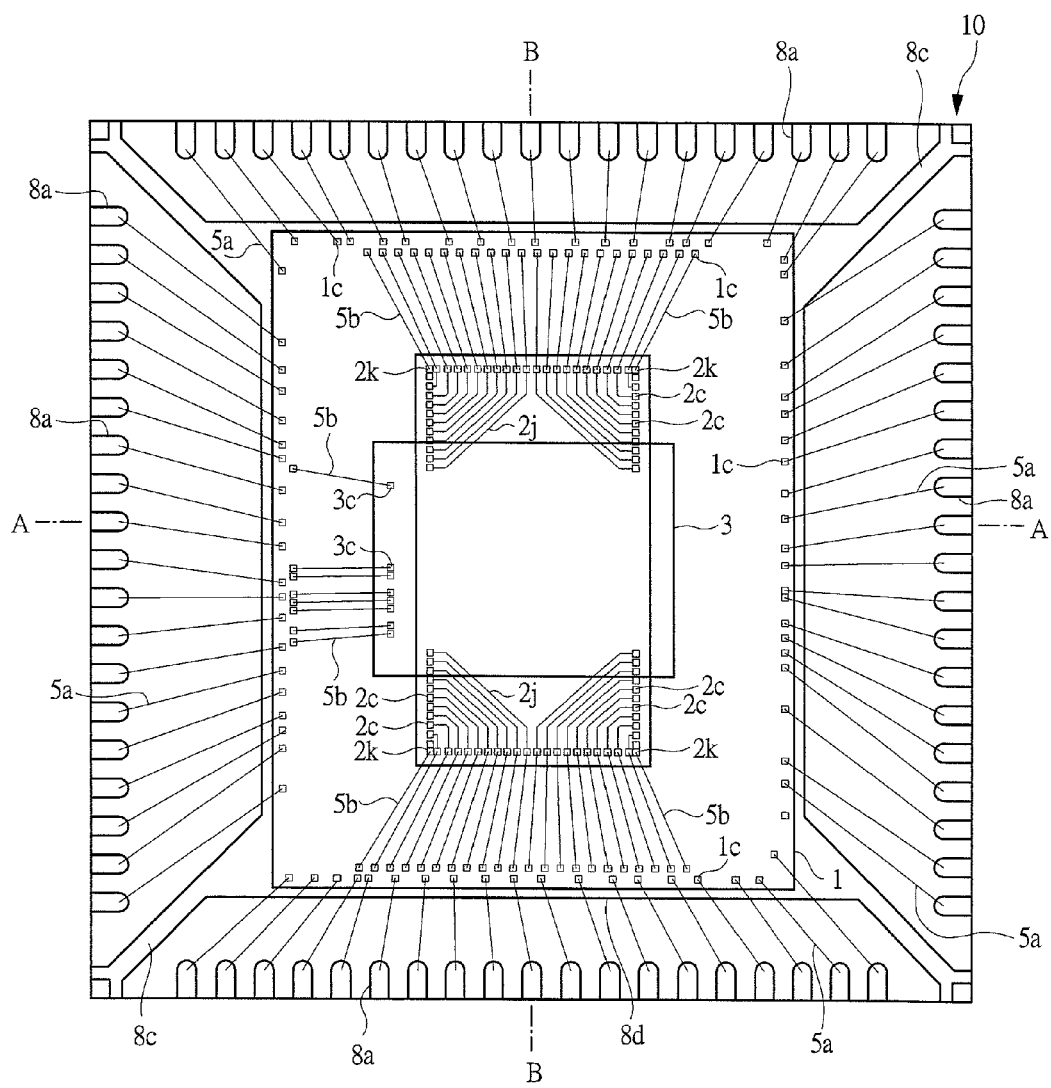
FIG. 42 is a plan view showing a structure of a semiconductor device of a modified example 3 of the present invention in a transparent manner through a sealing member.
Figure 43:
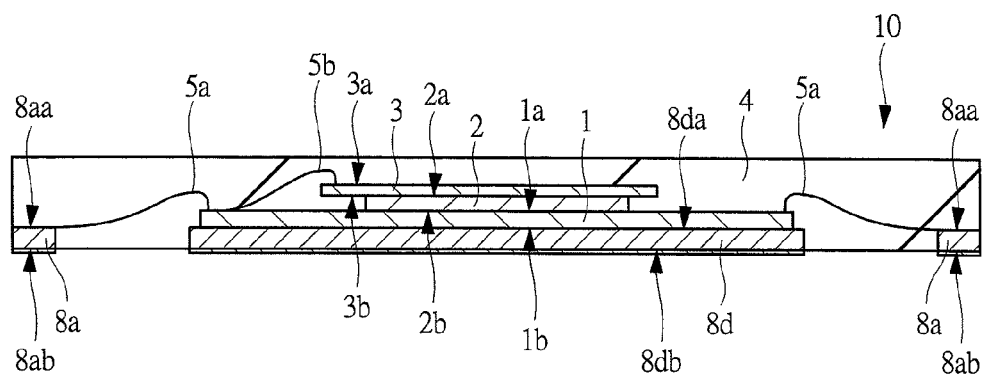
FIG. 43 is a cross-sectional view showing a structure taken along the A-A line of FIG. 42.
Figure 44:
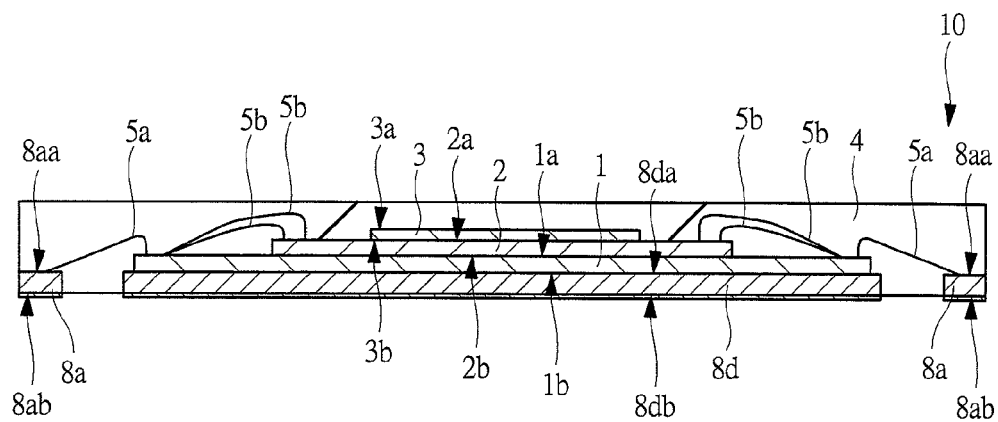
FIG. 44 is a cross-sectional view showing a structure taken along the B-B line of FIG. 42.

Moreover, in the aforementioned first and embodiments, the case where the semiconductor device is QFP has been described. However, as long as the semiconductor device is of the die-pad exposed type and has a structure in which a plurality of semiconductor chips are stacked, it is not limited to the QFP, and the semiconductor device may be a QFN (Quad Flat Non-leaded Package) 10 as shown in the modified example 3 of FIGS. 42 to 44. In the QFN 10, each of a plurality of leads 8*a* has an upper surface (wire bonding surface) 8*aa* and a lower surface (mounting surface) 8*ab*, and the lower surface 8*ab* of each lead 8*a* is exposed from the lower surface 4*b* of the sealing member 4 as an outer part.

Since the semiconductor device is the QFN 10, it becomes possible to reduce the outside size of the semiconductor device in comparison with the QFP 6 and the QFP 9 of the first and second embodiments.

It is needless to say that the QFP 9 of the large-tab structure of the modified example 1, the QFP 9 of the small-tab structure of the modified example 2, and the QFN 10 of the modified example 3 can also obtain the same effects as those of the QFP 9 of the first embodiment in addition to the abovementioned respective effects.

The present invention is applicable to a semiconductor device that is assembled by using a lead frame.

What is claimed is:

1. A semiconductor device comprising:
   a die pad having an upper surface and a lower surface opposite to the upper surface;
   a plurality of leads arranged around the die pad;
   a first semiconductor chip having a first main surface, a first semiconductor element formed on the first main surface, a plurality of first electrode pads formed on the first main surface and electrically connected to the first semiconductor element, a first protective film formed on the first main surface such that the plurality of first electrode pads are exposed, and a first rear surface opposite to the first main surface, the first semiconductor chip being mounted on the die pad such that the first rear surface is opposed to the upper surface of the die pad;
   a second semiconductor chip having a second main surface, a second semiconductor element formed on the second main surface, a plurality of second electrode pads formed on the second main surface and electrically connected to the second semiconductor element, a second protective film formed on the second main surface such that the plurality of second electrode pads are exposed, and a second rear surface opposite to the second main surface, the second semiconductor chip being mounted on the first semiconductor chip such that the second rear surface is opposed to the first main surface of the first semiconductor chip;
   a plurality of first conductive members electrically connecting the plurality of first electrode pads with the plurality of leads, respectively;
   a plurality of second conductive members electrically connecting the plurality of first electrode pads with the plurality of second electrode pads, respectively; and
   a sealing member sealing the die pad, the first semiconductor chip, the second semiconductor chip, the plurality of first conductive members and the plurality of second conductive members such that the lower surface of the die pad is exposed,
   wherein the second protective film is comprised of a polymeric material containing benzocyclobutene in a backbone thereof as an organic monomer.

2. The semiconductor device according to claim 1,
   wherein a wiring layer is further formed on the second main surface of the second semiconductor chip, and
   wherein the second protective film is formed on the wiring layer such that one portion of the wiring layer is exposed.

3. The semiconductor device according to claim 2,
   wherein a third semiconductor chip is further stacked on the second semiconductor chip,
   wherein the second electrode pads of the second semiconductor chip are formed at positions overlapped with the third semiconductor chip when seen in a plan view,
   wherein one portion of the wiring layer of the second semiconductor chip is formed at a position not overlapped with the third semiconductor chip when seen in a plan view, and
   wherein the second conductive members are electrically connected to the second electrode pads through the wiring layer.

4. The semiconductor device according to claim 3,
   wherein one portion of the sealing member is disposed on the third semiconductor chip.

5. The semiconductor device according to claim 4,
   wherein the sealing member is comprised of epoxy-based thermosetting resin.

6. The semiconductor device according to claim 1,
   wherein an outside size of the die pad is larger than an outside size of the first semiconductor chip when seen in a plan view, and
   wherein the die pad is electrically connected to the first electrode pads of the first semiconductor chip through the first conductive members.

7. The semiconductor device according to claim 1,
   wherein an outside size of the die pad is smaller than an outside size of the first semiconductor chip when seen in a plan view.

8. The semiconductor device according to claim 1,
   wherein the die pad is supported by a plurality of suspension leads, and
   wherein a bar lead is formed between the adjacent suspension leads among the plurality of suspension leads and between the die pad and the plurality of leads when seen in a plan view.

9. The semiconductor device according to claim 8,
   wherein the bar lead is disposed at a height between a height at which the die pad is positioned and a height at which the lead is positioned when seen in a cross-sectional view.

10. The semiconductor device according to claim 1,
    wherein a lower surface of each of the plurality of leads is exposed from a lower surface of the sealing member.

11. The semiconductor device according to claim 1,
    wherein on the first main surface of the first semiconductor chip, the plurality of first electrode pads are formed along each of four sides of the first main surface, and the plurality of leads are arranged around the four sides of the first main surface.

* * * * *